United States Patent
Merkel et al.

(10) Patent No.: US 11,886,110 B2
(45) Date of Patent: Jan. 30, 2024

(54) IMPRINTING APPARATUS

(71) Applicant: ILLUMINA, INC., San Diego, CA (US)

(72) Inventors: Timothy J. Merkel, Escondido, CA (US); Ruibo Wang, San Diego, CA (US); Daniel Wright, San Diego, CA (US); Danny Yuan Chan, San Diego, CA (US); Avishek Aiyar, San Diego, CA (US); Tanmay Ghonge, San Diego, CA (US); Neil Brahma, San Diego, CA (US); Arthur Pitera, Encinitas, CA (US)

(73) Assignee: Illumina, Inc., San Diego, CA (US)

( * ) Notice: Subject to any disclaimer, the term of this patent is extended or adjusted under 35 U.S.C. 154(b) by 115 days.

(21) Appl. No.: 17/209,814

(22) Filed: Mar. 23, 2021

(65) Prior Publication Data
US 2021/0302832 A1 Sep. 30, 2021

Related U.S. Application Data

(60) Provisional application No. 63/000,964, filed on Mar. 27, 2020.

(51) Int. Cl.
| | |
|---|---|
| G03F 7/00 | (2006.01) |
| B29C 59/02 | (2006.01) |
| C09D 183/14 | (2006.01) |
| G03F 7/16 | (2006.01) |

(Continued)

(52) U.S. Cl.
CPC .......... *G03F 7/0002* (2013.01); *B29C 59/022* (2013.01); *C09D 183/14* (2013.01); *G03F 7/162* (2013.01); *G03F 7/168* (2013.01); *B29K 2083/00* (2013.01); *B29K 2105/0002* (2013.01)

(58) Field of Classification Search
CPC ........ G03F 7/16; G03F 7/0755; G03F 7/0002; B29C 33/3828
See application file for complete search history.

(56) References Cited

U.S. PATENT DOCUMENTS

| | | | |
|---|---|---|---|
| 10,030,169 B2 | 7/2018 | Kuo et al. | |
| 2008/0269073 A1* | 10/2008 | Mirkin | B82Y 40/00 977/789 |
| 2017/0363953 A1* | 12/2017 | Steinhart | B82Y 10/00 |

(Continued)

FOREIGN PATENT DOCUMENTS

| | | | |
|---|---|---|---|
| JP | 2010084162 | 4/2010 | |
| JP | 2017181798 A * | 10/2017 | .......... C08F 230/085 |

(Continued)

OTHER PUBLICATIONS

Misumi English translation (Year: 2017).*

*Primary Examiner* — S. Behrooz Ghorishi
*Assistant Examiner* — John W Hatch
(74) *Attorney, Agent, or Firm* — Dierker & Kavanaugh, P.C.

(57) ABSTRACT

An imprinting apparatus includes a silicon master and an anti-stick layer coating the silicon master. The silicon master includes a plurality of features positioned at an average pitch of less than about 425 nm, each of the plurality of features comprises a depression having an opening with its largest opening dimension being less than about 300 nm. The anti-stick layer includes a crosslinked silane polymer network.

15 Claims, 8 Drawing Sheets

(51) Int. Cl.
  *B29K 83/00* (2006.01)
  *B29K 105/00* (2006.01)

(56) References Cited

U.S. PATENT DOCUMENTS

2018/0178416 A1* 6/2018 Richez ................. G03F 7/0002
2018/0186082 A1   7/2018 Randhawa

FOREIGN PATENT DOCUMENTS

TW    201005430 A1    2/2010
TW    201841716 A1   12/2018

\* cited by examiner

IMPRINTING APPARATUS

CROSS-REFERENCE TO RELATED APPLICATIONS

This application claims the benefit of U.S. Provisional Application Ser. No. 63/000,964, filed Mar. 27, 2020, the contents of which is incorporated by reference herein in its entirety.

BACKGROUND

Nano-imprinting technology may enable the economic and effective production of nanostructures. Nano-imprint lithography employs direct mechanical deformation of a resist material by a stamp having nanostructures. The resist material is cured while the stamp is in place to lock the shape of the nanostructures in the resist material.

Nano-imprint lithography has been used to manufacture patterned substrates, which may be used in a variety of applications. Some patterned substrates include fluidic channels and discrete wells or depressions. These patterned substrates may be built into flow cells. In some flow cells, active surface chemistry is introduced into the discrete depressions, while interstitial regions surrounding the discrete depressions remain inert. These flow cells may be particularly useful for detection and evaluation of a wide range of molecules (e.g., deoxyribonucleic acid (DNA)), families of molecules, genetic expression levels, or single nucleotide polymorphisms.

INTRODUCTION

In a first aspect, an imprinting apparatus comprises a silicon master including a plurality of features positioned at an average pitch of less than about 425 nm, each of the plurality of features comprising a depression having an opening with its largest opening dimension being less than about 300 nm; and an anti-stick layer coating a surface of the silicon master, the anti-stick layer including a crosslinked silane polymer network.

In an example of the first aspect, less than about 0.15% of a total number of the plurality of features has a membrane defect.

In an example of the first aspect, the anti-stick layer is generated with a formulation including: a first silane monomer:

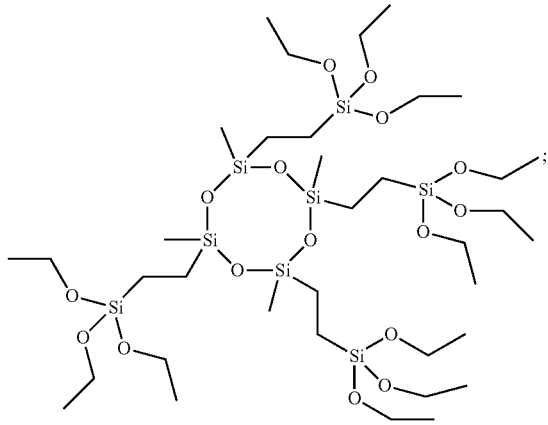 [SMILES: CCO[Si](CC[Si]1(C)O[Si](C)(CC[Si](OCC)(OCC)OCC)O[Si](C)(CC[Si](OCC)(OCC)OCC)O[Si](C)(CC[Si](OCC)(OCC)OCC)O1)(OCC)OCC]

and less than about 1.4 wt %, based on a total amount of silanes present in the formulation, of a second silane monomer including a hydrolyzable chloride group.

In an example of the first aspect, the anti-stick layer coats a wall of each of the depressions without capping the opening or without fully filling the depression.

In an example of the first aspect, the largest opening dimension of each of the plurality of features ranges from about 170 nm to about 290 nm.

In an example of the first aspect, the largest opening dimension of each of the plurality of features ranges from about 200 nm to about 250 nm.

In an example of the first aspect, the average pitch ranges from about 340 nm to about 410 nm.

In an example of the first aspect, the average pitch ranges from about 350 nm to about 400 nm.

It is to be understood that any features of the imprinting apparatus disclosed herein may be combined together in any desirable manner and/or configuration to achieve the benefits as described in this disclosure, including, for example, generating small, high-resolution features in a working stamp that is made using the imprinting apparatus and/or facilitating clean release of the working stamp that is made from the imprinting apparatus.

In a second aspect, a method comprises applying a formulation on a silicon master including a plurality of features positioned at an average pitch of less than about 425 nm, each of the plurality of features having a largest opening dimension being less than about 300 nm, the formulation including: a first silane monomer:

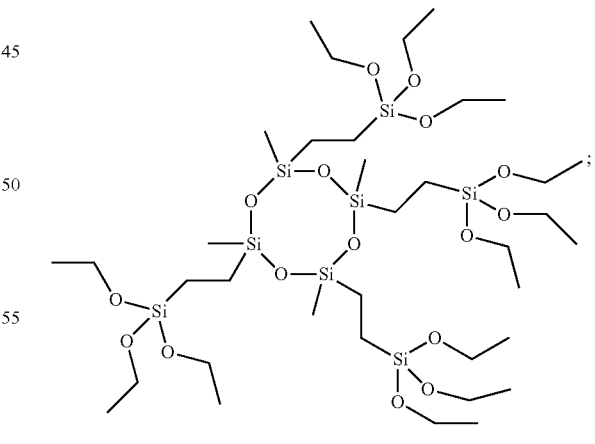

and less than about 1.4 wt %, based on a total amount of silanes present in the formulation, of a second silane monomer including a hydrolyzable chloride group;

and curing the applied formulation, thereby forming an anti-stick layer.

In an example of the second aspect, the second silane monomer is:

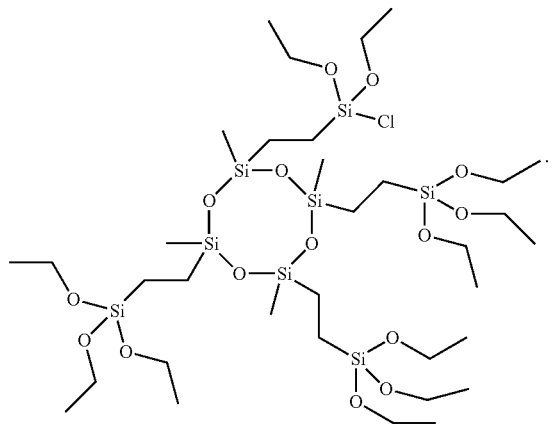 [SMILES: CCO[Si](Cl)(CC[Si]1(C)O[Si](C)(CC[Si](OCC)(OCC)OCC)O[Si](C)(CC[Si](OCC)(OCC)OCC)O[Si](C)(CC[Si](OCC)(OCC)OCC)O1)OCC]

In some of these examples, the formulation includes from about 0.28 wt % to about 1.1 wt % of the second silane monomer.

In an example of the second aspect, the formulation further includes: i) a dimer including two bonded units of the first silane monomer; ii) a trimer including three bonded units of the first silane monomer; iii) a higher molecular species including more than three bonded units of the first silane monomer; iv) the first silane monomer having at least one hydrolyzed ethoxy group; or v) any combination of i, ii, iii, and iv.

In an example of the second aspect, curing involves: an incubation process; a rinsing process after the incubation process; and a heating process after the rinsing process. In some of these examples, the incubation process and the heating processes are independently performed at a temperature ranging from about 20° C. to about 250° C., for a time ranging from about 1 minute to about 30 minutes.

An example of the second aspect, further comprises generating the formulation by: diluting a neat silane material including the first and second silane monomers in a first solvent to form a precursor solution; exposing the precursor solution to an aqueous, basic solution to generate an aqueous phase and an organic phase, wherein the organic phase includes the first solvent; removing the aqueous phase; removing the first solvent from the organic phase to obtain a purified silane material; and diluting the purified silane material in a second solvent. In some of these examples, the second solvent is an aprotic solvent that i) solvates the purified silane material and ii) has a boiling point ranging from about 50° C. to about 250° C. In some of these examples, the purified silane material is present in the formulation in an amount ranging from about 1 wt % to about 20 wt %.

In an example of the second aspect, applying the formulation involves spin coating.

In an example of the second aspect, one of: the formulation is solvent free; or the formulation includes from about 1 wt % to about 20 wt % of the first silane monomer.

It is to be understood that any features of this method may be combined together in any desirable manner. Moreover, it is to be understood that any combination of features of the method and/or of the imprinting apparatus may be used together, and/or combined with any of the examples disclosed herein to achieve the benefits as described in this disclosure, including, for example, to generate small, high-resolution features in an imprinting stamp and/or a working stamp that is made using the imprinting apparatus, and/or to facilitate clean release of the working stamp that is made from the imprinting apparatus.

In a third aspect, another method comprises forming an imprinting apparatus by: depositing a formulation on a silicon master including a plurality of features positioned at an average pitch of less than about 425 nm, each of the plurality of features having a largest opening dimension of less than about 300 nm, and the formulation including: a first silane monomer:

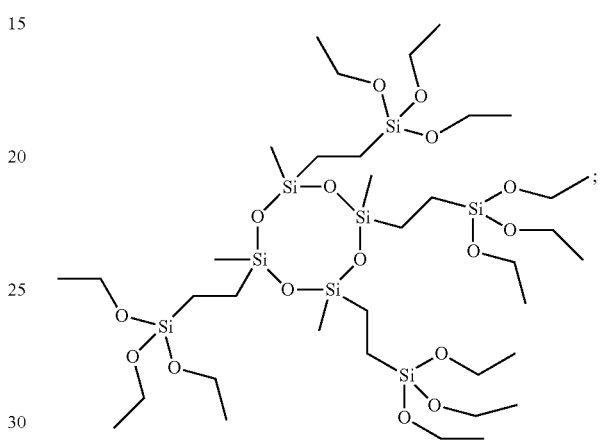

and less than 1.4 wt %, based on a total amount of silanes present in the formulation, of a second silane monomer including a hydrolyzable chloride group; and curing the formulation, thereby forming an anti-stick layer on the silicon master; depositing a silicon-based working stamp material on the anti-stick layer of the imprinting apparatus; curing the silicon-based working stamp material to form a working stamp including a negative replica of the plurality of features; and releasing the working stamp from the imprinting apparatus.

In an example of the third aspect, curing the formulation involves: an incubation process; a rinsing process after the incubation process; and a heating process after the rinsing process. In some of these examples, the incubation and heating processes are independently performed at a temperature ranging from about 20° C. to about 250° C., for a time ranging from about 1 minute to about 30 minutes.

In an example of the third aspect, the silicon-based working stamp material includes a silicon acrylate monomer.

It is to be understood that any features of this method may be combined together in any desirable manner. Moreover, it is to be understood that any combination of features of this method and/or of the other method and/or of the imprinting apparatus may be used together, and/or combined with any of the examples disclosed herein to achieve the benefits as described in this disclosure, including, for example, to generate small, high-resolution features in an imprinting stamp and/or a working stamp that is made using the imprinting apparatus, and/or to facilitate clean release of the working stamp that is made from the imprinting apparatus.

Still further, it is to be understood that any features of any of the methods and/or of any of the imprinting apparatuses may be combined together in any desirable manner, and/or may be combined with any of the examples disclosed herein at least to achieve the benefits as described herein.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Figure 1:
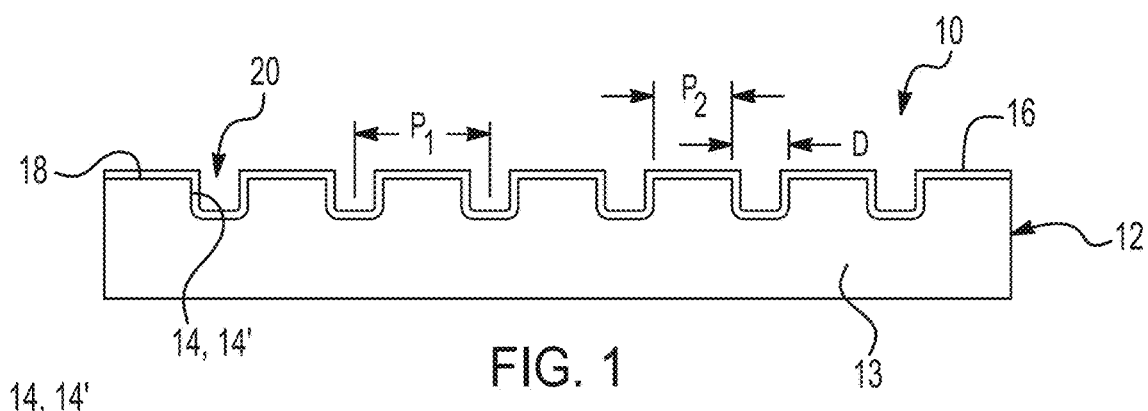
FIG. 1 is a cross-section of an example of the imprinting apparatus disclosed herein.

Patterning technology has been used to create individual depressions in flow cell surfaces. The depressions may be functionalized, for example, with capture primers. Within each of the functionalized depressions, monoclonal populations (localized and independent clusters) of amplicons can be generated from respective genetic oligonucleotide fragments. A higher cluster density may be obtained when the depressions have small dimensions and a low pitch (e.g., the spacing from the center of one depression to the center of an adjacent or nearest neighboring depression or from the edge of one depression to the edge of an adjacent or nearest neighboring depression). Higher cluster density means that more bases can be read from a given unit area, which increases the genetic yield from the patterned flow cell.

Nanoimprint lithography (NIL) is one example of a high-throughput patterning technique that enables high precision and lower costs, than, for example, patterning techniques using photons or electrons. NIL utilizes a working stamp to create features (e.g., flow cell depressions) in an imprintable material (e.g., a curable resin). The pattern of the working stamp is a negative replica of the desired features to be formed. The working stamp may be created from a master template having the pattern of the desired features. Some master templates have an anti-stick layer to aid in the clean transfer of the pattern to the working stamp material and the clean release of the working stamp from the master template.

Some anti-stick layers are generated by depositing and curing a formulation, including a neat silane material, on a surface of the master template. The present inventors have discovered that some neat silane materials can generate undesirable defects in features and/or at feature openings of the master template when the feature opening dimension is below about 300 nm and the pitch is below about 425 nm. The defect is a film or membrane that may form during heating and that may not be readily removable via rinsing. This defect is referred to herein as a "membrane defect." The membrane defect can clog (fill) the feature or cap the feature opening. The anti-stick layer may coat, such as conformally coating as in one instance, the walls of the features, and thus may take on the same shape as the feature and occupy some space of the feature opening. However, capping refers to the instance where the anti-stick layer extends beyond conformal coating so that it extends over the remaining feature opening and at least partially (e.g., partially or fully) blocks the feature opening. Clogged or capped features partially or fully obstruct replication of these features during working stamp fabrication.

Without being bound to any particular theory, the present inventors have attributed the formation of these membrane defects at least in part to the presence of a particular silane monomer in the neat silane material. This particular silane monomer includes a hydrolyzable chloride group (e.g., Si—Cl). The hydrolyzable chloride group may affect the solution and deposition characteristics of a formulation including the neat silane material. The rate of hydrolysis of Si—Cl groups is faster than that of Si—OCH$_2$CH$_3$ groups, which are present on the desired silane monomer in the neat silane material. As such, the Si—Cl groups may increase the formulation's sensitivity to water, which is introduced during formulation preparation. Hydrolysis is the first step towards polymerization of the silane into higher molecular weight species such as dimers, trimers, other higher molecular weight species, and highly crosslinked infinite polymer networks (the latter of which make up the cured anti-stick layer). The Si—Cl groups rapidly form silanols and an acid (e.g., hydrochloric acid (HCl)) byproduct. The hydrolysis reaction, and the subsequent reaction with a neighboring reactive group, can be catalyzed by the acid, which further reduces solution stability and increases the kinetics of formation of higher molecular weight species. Drying may concentrate loosely bound dimers, trimers, and/or higher molecular weight species, which continue to rapidly polymerize and crosslink. The receding droplet edge may leave the film or membrane in or on the master template features (e.g., depressions), thus creating the membrane defects.

In the examples disclosed herein, the formulation that is deposited and cured to generate the anti-stick layer includes a first silane monomer:

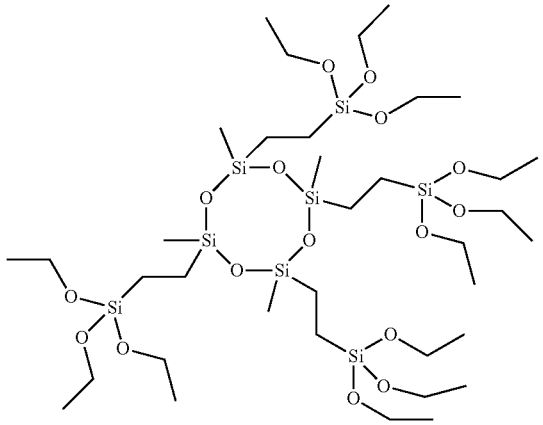 [SMILES: CCO[Si](CC[Si]1(C)O[Si](C)(CC[Si](OCC)(OCC)OCC)O[Si](C)(CC[Si](OCC)(OCC)OCC)O[Si](C)(CC[Si](OCC)(OCC)OCC)O1)(OCC)OCC]

(which includes the slower polymerizing Si—OCH$_2$CH$_3$ groups); and about 1.4 wt % or less, based on a total amount of silanes present in the formulation, of a second silane monomer including the hydrolyzable chloride group. The resulting anti-stick layer includes a crosslinked silane polymer network formed from i) the reacted first silane monomers and higher molecular weight adducts thereof, and ii) a minimal amount of the reacted second silane monomers. Any unreacted monomers, dimers, trimers, and higher molecular weight species that are still soluble are washed away, and thus are not part of the crosslinked silane polymer network. Because the formulation used to generate the anti-stick layer has about 1.4 wt % or less, based on a total amount of silanes present, of a second silane monomer, minimal or no membrane defects are formed. In some instances, the anti-stick layer has no membrane defects and thus may be considered to be defect free. In other instances, the anti-stick layer may include minimal membrane defects, e.g., less than 0.15% of the depressions have a membrane defect. In some instances, less than 0.14%, or less than 0.13%, or less than 0.12%, or less than 0.11%, or less than 0.10%, or less than 0.09%, or less than 0.08%, or less than 0.07%, etc. In any of these instances, the lower limit is greater than zero. In these instances, the anti-stick layer may be considered to be substantially defect free. The phrase "at least substantially defect free" means that the anti-stick layer is defect free or substantially defect free.

The at least substantially defect free anti-stick layer of the imprinting apparatus disclosed herein contributes to the clean transfer of the pattern of features to a working stamp material. The working stamp, in turn, leads to the controlled formation of features that have small dimensions and that are positioned at a tight (low) pitch. As mentioned, this may be particularly desirable for flow cell depressions as the genetic yield from the patterned flow cell may be increased.

Definitions

It is to be understood that terms used herein will take on their ordinary meaning in the relevant art unless specified otherwise. Several terms used herein and their meanings are set forth below.

The singular forms "a", "an", and "the" include plural referents unless the context clearly dictates otherwise.

The terms comprising, including, containing and various forms of these terms are synonymous with each other and are meant to be equally broad.

The terms top, bottom, lower, upper, on, etc. are used herein to describe the flow cell and/or the various components of the flow cell. It is to be understood that these directional terms are not meant to imply a specific orientation, but are used to designate relative orientation between components. The use of directional terms should not be interpreted to limit the examples disclosed herein to any specific orientation(s).

The term "anti-stick layer," as used herein, refers to a film comprising a crosslinked silane polymer network. The monomer and its higher molecular weight adducts (dimers, trimers, etc.) that polymerize and crosslink to form the crosslinked silane polymer network is referred to herein as the first silane monomer (see structure below). The formulation used in generating the anti-stick layer may also include small amounts of what is referred to herein as the second silane monomer (see structure below). The second silane monomer may polymerize and crosslink to form a small part of the crosslinked silane polymer network. Any unreacted monomers and loosely bound higher molecular weight species that remain soluble in the formulation or wash solvent are not present in the anti-stick layer, as they are removed during processing. The anti-stick layer is also capable of bonding to an underlying substrate.

The term "membrane defect" refers to a thin film or membrane of an anti-stick layer that fills, and thus clogs, a feature of an imprinting apparatus or that is positioned over, and thus caps, a portion or all of a feature opening.

The term "depositing," as used herein, refers to any suitable application technique, which may be manual or automated, and, in some instances, results in modification of the surface properties. Generally, depositing may be performed using vapor deposition techniques, coating techniques, grafting techniques, or the like. Some specific examples include chemical vapor deposition (CVD), spray coating (e.g., ultrasonic spray coating), spin coating, dunk or dip coating, doctor blade coating, puddle dispensing, flow through coating, aerosol printing, screen printing, microcontact printing, inkjet printing, or the like.

As used herein, the term "depression" refers to a discrete concave feature in a substrate, patterned resin, etc. having a surface opening that is at least partially surrounded by interstitial region(s) of the substrate, resin, etc. Depressions can have any of a variety of shapes at their opening in a surface including, as examples, round, elliptical, square, polygonal, star shaped (with any number of vertices), etc. The cross-section of a depression taken orthogonally with the surface can be curved, square, polygonal, hyperbolic, conical, angular, etc.

The term "each," when used in reference to a collection of items, is intended to identify an individual item in the collection, but does not necessarily refer to every item in the collection. Exceptions can occur if explicit disclosure or context clearly dictates otherwise.

A "feature," as used herein, refers to a point or area in a pattern that can be distinguished from other points or areas according to relative location. Example features include depressions in a substrate, projections from a substrate, ridges on a substrate, etc. In one example, each of the plurality of features of the imprinting apparatus is a depression.

The "first silane monomer" refers to:

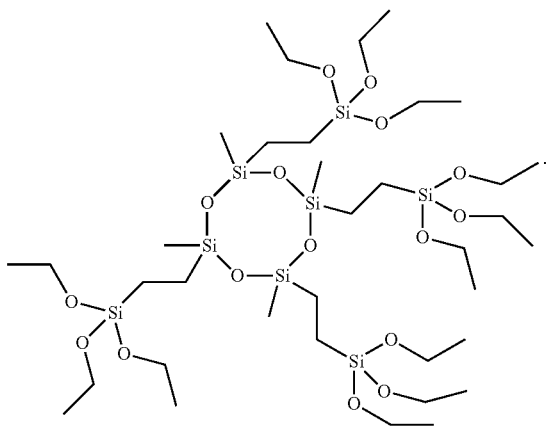 [SMILES: CCO[Si](CC[Si]1(C)O[Si](C)(CC[Si](OCC)(OCC)OCC)O[Si](C)(CC[Si](OCC)(OCC)OCC)O[Si](C)(CC[Si](OCC)(OCC)OCC)O1)(OCC)OCC]

The formulation used in generating the anti-stick layer may also include a hydrolyzed form of the first silane monomer, where one or more of the ethoxy groups are hydrolyzed ($CH_3CH_2O$—Si→HO—Si). This intermediate monomer is utilized in the polymerization of the first silane monomer into the higher molecular weight crosslinked polymer network.

The phrases "formed from" and "generated with" may be used herein with reference to the anti-stick layer and its precursor formulation. As one example, the anti-stick layer may be formed from the formulation. As another example, the anti-stick layer may be generated with the formulation. In either instance, "formed from" or "generated with" is intended to mean that the formulation is used during processing to create the anti-stick layer. These terms are not meant to imply that all of the formulation components end up as components in the anti-stick layer. For example, solvent(s), unreacted monomers, and higher molecular weight species that remain soluble in the formulation or a wash solution, which may be present in the formulation, are not part of the final anti-stick layer.

As used herein, the term "flow cell" is intended to mean a vessel having a chamber (e.g., flow channel) where a reaction can be carried out, an inlet for delivering reagent(s) to the chamber, and an outlet for removing reagent(s) from the chamber. In some examples, the chamber enables the detection of the reaction that occurs in the chamber. For example, the chamber/flow channel can include one or more transparent surfaces allowing for the optical detection of arrays, optically labeled molecules, or the like, at the depression(s).

A "higher molecular weight species or adduct" is a polymeric unit that includes more than three bonded monomeric units. A "dimer" specifically refers to a polymeric species with two bonded monomeric units. A "trimer" specifically refers to a polymeric species with three bonded monomeric units. Some dimers, trimers, and higher molecular weight species polymerize and crosslink to form the crosslinked silane polymer network. Other dimers, trimers, and higher molecular weight species may remain soluble in the formulation or in a wash solution, and thus do not become integrated into the crosslinked silane polymer network.

The term "imprint defect" refers to a portion of an imprinted resin or material that does have a feature transferred thereto from an imprinting apparatus due to a membrane defect present in the imprinting apparatus.

As used herein, the term "interstitial region" refers to an area on a surface (e.g., of a substrate, patterned resin, etc.) that separates features. For example, an interstitial region can separate one feature of an array from another feature of an array or pattern. The two features that are separated from each other can be discrete, i.e., lacking physical contact with each other. In another example, an interstitial region can separate a first portion of a feature from a second portion of a feature. In many examples, the interstitial region is continuous, whereas the features are discrete, for example, as is the case for a plurality of depressions defined in an otherwise continuous surface. The separation provided by an interstitial region can be partial or full separation. Interstitial regions may have a surface material that differs from the surface material of the features defined in the surface. For example, features of a flow cell array can have an amount or concentration of a polymer coating and primer(s) that exceeds the amount or concentration present at the interstitial regions. In some examples, the polymer coating and primer(s) may not be present at the interstitial regions.

The term "neat silane material," as used herein, refers to the silane monomer(s) and, in some instances, higher molecular weight species or adducts thereof, without any solvent, catalyst, initiator, or other added components. In some examples, the neat silane material may consist of the first silane monomer, and less than about 1.4 wt % of the second silane monomer, based on a total amount of silanes present in the neat silane material. In other examples, the neat silane material may consist of the first silane monomer, a hydrolyzed form of the first silane monomer, and less than about 1.4 wt % of the second silane monomer, based on a total amount of silanes present in the neat silane material. In addition to the first silane monomer, some examples of the neat silane material may also include dimers, trimers, and/or other higher molecular weight species or adducts of the first silane monomer. In one example, the neat silane material includes from about 65 wt % to about 100 wt % of the first silane monomer, and from about 0 wt % to about 35 wt % of the dimers, trimers, and/or other higher molecular weight species or adducts of the first silane monomer. The amount of the second silane monomer based on a total amount of silanes present in the neat silane material may be small. For example, this amount may be less than about 2 wt %—e.g., less than about 1.5 wt %, about 1.4 wt %, about 1.3 wt %, about 1.2 wt %, about 1.1 wt %, about 1 wt %, about 0.9 wt %, about 0.8 wt %, about 0.7 wt %, about 0.6 wt %, about 0.5 wt %, about 0.4 wt %, about 0.3 wt %, about 0.2 wt %, about 0.1 wt %, about 0.05 wt %, about 0.02 wt %, about 0.01 wt %, about 0.005 wt %, about 0.002 wt %, about 0.001 wt %, or less. In some examples, the neat silane material includes from 0 wt % to about 1.25 wt % of the second silane monomer, or from about 0.001 wt % to about 1 wt % of the second silane monomer.

The term "pitch," as used herein, refers to the spacing of the features. In one example, the pitch refers to the spacing from the center of one feature to the center of an adjacent or nearest neighboring feature. This pitch may be referred to as center-to-center spacing. In another example, the pitch refers to the spacing from the right edge of one feature to the left edge of an adjacent or nearest neighboring feature. This pitch may be referred to as edge-to-edge spacing. In one example, where the features are depressions (e.g., wells, such as nanowells), a "pitch" refers to the center-to-center spacing between two adjacent depressions.

As used herein, the "primer" is defined as a single stranded nucleic acid sequence (e.g., single strand DNA). Some primers, which may be referred to as amplification primers, serve as a starting point for template amplification and cluster generation. Other primers, which may be referred to as sequencing primers, serve as a starting point for DNA synthesis. The 5' terminus of the primer may be modified to allow a coupling reaction with a functional group of a polymer coating. The primer length can be any number of bases long and can include a variety of non-natural nucleotides. In an example, the sequencing primer is a short strand, ranging from 10 to 60 bases, or from 20 to 40 bases.

The "second silane monomer" refers to a cyclosiloxane with at least one a hydrolyzable chloride group. In an example, the second silane monomer is:

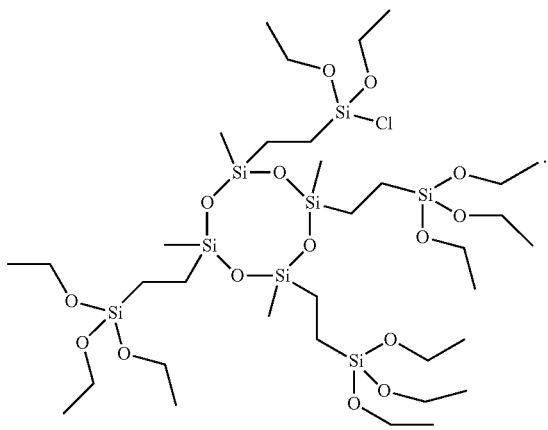 [SMILES: CCO[Si](Cl)(CC[Si]1(C)O[Si](C)(CC[Si](OCC)(OCC)OCC)O[Si](C)(CC[Si](OCC)(OCC)OCC)O[Si](C)(CC[Si](OCC)(OCC)OCC)O1)OCC]

Imprinting Apparatus

An example of the imprinting apparatus 10 is shown in FIG. 1. The imprinting apparatus 10 includes a silicon master 12 including a plurality of features 14 positioned at an average pitch $P_1$ or $P_2$ of less than 425 nm, each of the plurality of features 14 comprising a depression having an opening with its largest opening dimension D being less than about 300 nm; and an anti-stick layer 16 coating the silicon master 12, the anti-stick layer 16 including a crosslinked silane polymer network. In some examples, less than 0.15% of a total number of the plurality of features 14 has a membrane defect.

The silicon master 12 is a substrate 13 that has a pattern of the features 14 defined therein. The features 14 may be defined via etching. This pattern is representative of the desired pattern of features 14 in a final product, such as a flow cell. The silicon master 12 serves as a master mold for creating a working stamp or a plurality of working stamps, each of which has a negative replica of the pattern, and thus can be used to create the final product.

Figure 2A:
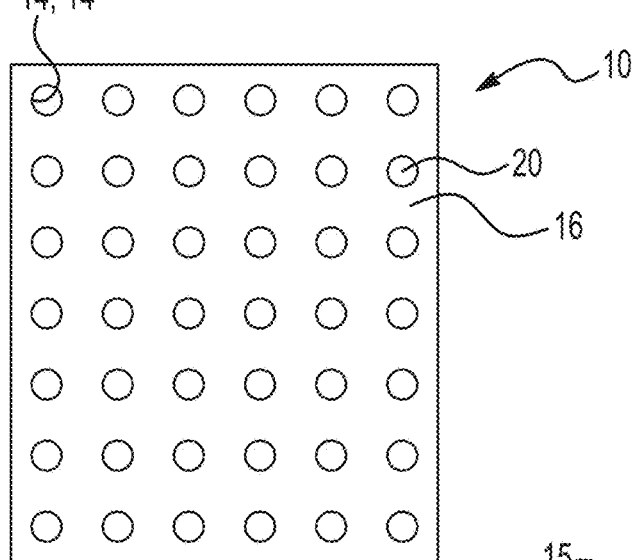
FIG. 2A is a top view of an example of the imprinting apparatus including a single silicon master.
Figure 2B:
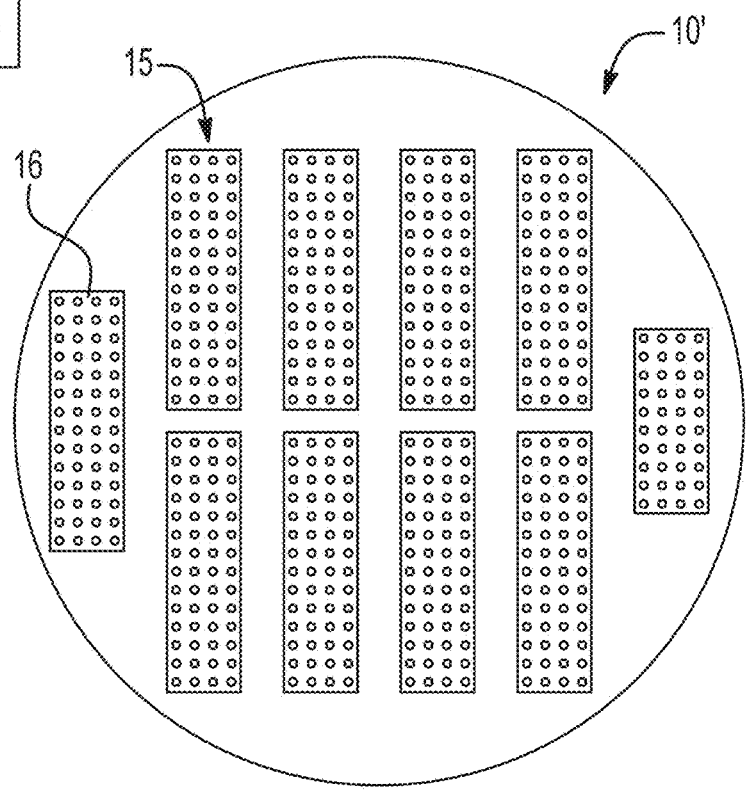
FIG. 2B is a top view of another example of the imprinting apparatus including a plurality of silicon masters.

In some instances, the substrate 13 of the silicon master 12 is fully patterned with features 14. In these instances, one substrate 13 may have all of the features 14 of the pattern defined therein. A top view of an example of this imprinting apparatus 10 is shown in FIG. 2A. This imprinting apparatus 10 may be used to create a single working stamp. In other instances, the substrate 13 of the silicon master 12 is patterned with multiple, separate and distinct patterned areas 15. In these instances, each separate and distinct patterned area 15 includes a set of features 14. In these instances, the substrate 13 has the respective sets of features 14 defined therein, where each respective set of features 14 is defined at a particular position in the substrate 13. A top view of an example of this imprinting apparatus 10' is shown in FIG. 2B. As depicted, the features 14 of each patterned area 15 are defined in respective positions across the wafer. This imprinting apparatus 10' may be used to create a plurality of working stamps.

The substrate 13 of the silicon master 12 may comprise silicon, silicon dioxide ($SiO_2$), or layers of any combinations thereof.

As mentioned, the silicon master 12 includes the features 14 defined in the substrate 13. In the examples disclosed herein, the features 14 are depressions.

In the examples disclosed herein, the features 14 are positioned at an average pitch $P_1$ or $P_2$ of less than about 425 nm. In some instances, the features 14 are positioned at an average pitch $P_1$ or $P_2$ of less than about 430 nm, about 425 nm, about 420 nm, about 415 nm, or less. The pitch $P_1$ in FIG. 1 illustrates the center-to-center spacing. The pitch $P_2$ in FIG. 1 illustrates the edge-to-edge spacing. The formulation disclosed herein is exposed to a curing process that generates the anti-stick layer 16 on the surface of the silicon master 12 having the features 14 at these tight pitches without generating the clogging or capping membrane defects described herein. As such, the formulation is particularly suitable for the tight pitch ranges disclosed herein. In some examples, the average pitch $P_1$ or $P_2$ ranges from about 340 nm to about 410 nm. In some other examples, the average pitch $P_1$ or $P_2$ ranges from about 350 nm to about 400 nm.

The features 14 in a given pattern (e.g., patterned area 15) of the silicon master 12 may have any desirable layout for the final product. The layout may be a regular, a repeating, or a non-regular pattern. In an example, the features 14 are disposed in a hexagonal grid for close packing and improved density. Other layouts may include, for example, rectilinear (i.e., rectangular) layouts (e.g., lines or trenches), triangular layouts, and so forth. In some examples, the layout or pattern can be an x-y format of features 14 that are in rows and columns. In some other examples, the layout or pattern can be a repeating arrangement of features 14 and/or interstitial regions 18. In still other examples, the layout or pattern can be a random arrangement of features 14 and/or interstitial regions 18. The pattern may include stripes, swirls, lines, triangles, rectangles, circles, arcs, checks, diagonals, arrows, squares, etc.

In the examples disclosed herein, each feature 14 is a depression 14' having an opening 20. Depressions 14' can have any of a variety of shapes at their opening 20 in the surface of the silicon master 12 including, as examples, round, elliptical, square, polygonal, etc. The largest dimension of the opening 20 may depend upon the shape of the opening 20. For example, when the opening 20 is a circle or oval, the largest dimension D is, respectively, the diameter or the long axis. For another example, when the opening 20 is a square or rectangle, the largest dimension D is the length. The largest opening dimension D is less than about 300 nm. In some instances, the largest opening dimension D is less than about 310 nm, about 305 nm, about 300 nm, about 295 nm, or less. In some examples, the largest opening dimension D ranges from about 170 nm to about 290 nm. In some other examples, the largest opening dimension D ranges from about 180 nm to about 270 nm, or from about 200 nm to about 250 nm.

The three-dimensional shape inside the depression 14' can resemble a cylinder, a cube, a rectangular prism, a cone, etc.

Each feature 14 (e.g., depression 14') can also be defined by its volume and/or depth.

The minimum or maximum feature volume can be selected based on the final product that is to be formed using the working stamp, which is formed using the imprinting apparatus 10 or 10'. For example, when the final product is a flow cell, the volume of the feature 14 of the silicon master 12 may be selected so that the final flow cell depressions can accommodate the throughput (e.g., multiplexity), resolution, nucleotides, or analyte reactivity expected for downstream uses of the flow cell. For example, the volume can be at least about $1 \times 10^{-3}$ μm$^3$, about $1 \times 10^{-2}$ μm$^3$, about 0.1 μm$^3$, about 1 μm$^3$, about 10 μm$^3$, about 100 μm$^3$, or more, or less.

Similarly, the feature depth can also be selected based on the final product that is to be formed using the working stamp, which is formed using the imprinting apparatus 10 or 10'. For example, when the final product is a flow cell, the depth of the feature 14 of the silicon master 12 may be selected so that the final flow cell depressions can house a polymeric hydrogel and primers. In an example, the depth may be about 0.1 μm, about 0.5 μm, about 1 μm, about 10 μm, about 100 μm, or more, or less. In some examples, the depth is about 0.2 μm or 0.4 μm. The depth of each feature 14 can be greater than, less than or between the values specified above.

The anti-stick layer 16 coats the silicon master 12. As shown in FIG. 1, the anti-stick layer 16 conformally coats the exposed surfaces of the silicon master 12, including along the walls of the features 14 (e.g., depressions 14') and on the interstitial regions 18. In some examples, the anti-stick layer 16 coats a wall of each of the depressions 14' conformally (and thus takes on the shape of the depression 14') without extending over, and thus capping the opening 20 or without filling the depression 14'. In these examples, the anti-stick layer 16 does not clog the features 14/depressions 14' and does not form a capping membrane that covers at least some of the opening 20. In all of the examples disclosed herein, less than 0.15% of a total number of the plurality of features 14 (e.g., depressions 14') has a membrane defect. In other words, less than 0.15% of the total number of the plurality of features 14 is clogged or capped by a membrane defect. In some instances, less than 0.2% of the total number of the plurality of features 14 is clogged or capped by a membrane defect. In some instances, less than 0.15% of the total number of the plurality of features 14 is clogged or capped by a membrane defect. In some instances, less than 0.13% of the total number of the plurality of features 14 is clogged or capped by a membrane defect. In some instances, less than 0.12% of the total number of the plurality of features 14 is clogged or capped by a membrane defect. In some instances, less than 0.11% of the total number of the plurality of features 14 is clogged or capped by a membrane defect. In some instances, less than 0.1% of the total number of the plurality of features 14 is clogged or capped by a membrane defect. In other instances, less than 0.05% of the total number of the plurality of features 14 is clogged or capped by a membrane defect. A higher percentage of membrane defects leads to a higher percentage of features 14 that cannot be transferred from the imprinting apparatus 10 to a working stamp, or from the working stamp to an imprinted resin. A reduced number of features in the imprinted resins can lead to a reduced number of depressions where sequencing reactions can take place, which can deleteriously affect the sequencing workflow and/or results. In some instances, even 0.15% of membrane defects is undesirable (see, e.g., Example 2 and FIG. 6D), as the final imprinted resin may have too many unusable depressions. In many instances, less than 0.15% (e.g., less than 0.1%, less than 0.05%, etc.) of membrane defects is desirable.

The anti-stick layer 16 includes a crosslinked silane polymer network generated by the polymerization and crosslinking of i) the first silane monomer and higher molecular weight adducts thereof, and if present, ii) the minimal amount of the second silane monomer and higher molecular weight adducts thereof. The anti-stick layer 16 does not include unreacted monomers, dimers, trimers, and oligomers that may be part of the formulation used to generate the anti-stick layer 16. These unreacted monomers, dimers, trimers, and higher molecular weight species may remain soluble in the formulation or in a wash solution, and do not become integrated into the crosslinked silane polymer network.

The anti-stick layer 16 also has a suitable surface energy to support stable wetting of the working stamp material into a thin film on the imprinting apparatus 10, 10'. In an example, the surface energy of the anti-stick layer 16 is defined by the water contact angle, which may range from about 70° to about 90°, or from about 75° to about 85°.

Formulation and Method of Making the Imprinting Apparatus

In the examples disclosed herein, the anti-stick layer 16 is formed from a formulation including the first silane monomer:

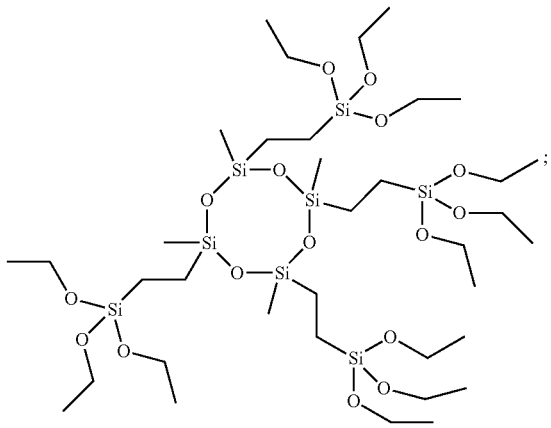 [SMILES: CCO[Si](CC[Si]1(C)O[Si](C)(CC[Si](OCC)(OCC)OCC)O[Si](C)(CC[Si](OCC)(OCC)OCC)O[Si](C)(CC[Si](OCC)(OCC)OCC)O1)(OCC)OCC]

and less than about 1.4 wt %, based on a total amount of silanes present in the formulation, of the second silane monomer including the hydrolyzable chloride group. In these examples, the hydrolyzable chlorides may be present in an amount of less than about 500 ppm. In some examples, the formulation includes none of the second silane monomer. In other examples, the formulation includes from about 0.28 wt % to about 1.1 wt % of the second silane monomer, based on the total amount of silanes present in the formulation. In these examples, the hydrolyzable chlorides may be present in an amount ranging from about 100 ppm to about 400 ppm. In still other examples, the formulation includes from about 0.1 wt % to about 1 wt % of the second silane monomer, based on the total amount of silanes present in the formulation.

The first silane monomer and second silane monomer may be present in a neat silane material. In some examples, the neat silane material consists of the first silane monomer and the second silane monomer. In other examples, the neat silane material may include other species of the first silane monomer. For example, some of the first silane monomers in the neat silane material may have undergone hydrolysis, and thus some of the first silane monomers may include hydrolyzed ethoxy groups. For another example, some of the first silane monomers in the neat silane material may have undergone initial polymerization, and thus some dimers, trimers, or other higher molecular weight species may be present in the formation. In an example, the formulation further includes i) a dimer including two bonded units of the first silane monomer; ii) a trimer including three bonded units of the first silane monomer; iii) a higher molecular species including more than three bonded units of the first silane monomer iv) the first silane monomer having at least one hydrolyzed ethoxy group; or v) any combination of i), ii), iii), and iv). In still other examples, the neat silane material may include the first silane monomer, any one or more of the other species of the first silane monomer, the second silane monomer, and one or more other species of the second silane monomer. Other species of the second silane monomers in the neat silane material may include dimers, trimers, and higher molecular weight species, and/or hydrolysis byproducts of the second silane monomer and/or acid byproducts of the second silane monomer.

The neat silane material may be formulated with the first silane monomer and without the second silane monomer or with the desirable low level of the second silane monomer. In some examples, this neat silane material may be applied as the formulation. These examples of the formulation are solvent free. In other examples, this neat silane material may be diluted in a solvent. Examples of suitable solvents include any aprotic solvent that i) solvates the neat silane material and ii) has a boiling point ranging from about 50° C. to about 250° C. The boiling point should be low enough to facilitate facile removal during heating, but high enough that the application process used to deposit the formulation does not result in rapid drying of the applied formulation. Examples of suitable aprotic solvents include tetrahydrofuran (THF), 2-methyltetrahydrofuran (MeTHF), propylene glycol methyl ether acetate (PGMEA), toluene, etc. The solvent may be used in any suitable amount that results in the formulation including from about 1 wt % to about 20 wt % of the first silane monomer.

When the formulation is prepared with the desirable low level of the second silane monomer, it may also be desirable to store the formulation for a time before applying it to form the anti-stick layer 16. Allowing the formulation to age may improve the coatability of the formulation, in part because hydrolysis of the first silane monomer is initiated prior to coating. In an example, the formulation may be stored at room temperature conditions (e.g., from 18° C. to about 22° C.) for about 2 days to about 14 days.

The neat silane material may alternatively be formulated with the first silane monomer, and the second silane monomer at levels higher than the desirable low level of less than about 1.4 wt %. In these examples, the neat silane material may be processed prior to being incorporated into the formulation. The processing can convert the Si—Cl to SiOH via hydrolysis, and the acid byproduct (HCl) can be removed. In the formulation, both the first and second silane monomers can be hydrolyzed to some extent to react to the substrate surface and to crosslink, so Si—Cl conversion and HCl byproduct removal prior to generating the formulation may be desirable. The processing can reduce the amount of the second silane monomer to less than about 1.4 wt % (based on a total amount of silanes present in the neat formulation).

In these examples, generating the formulation may involve diluting a neat silane material including the first and second silane monomers in a first solvent to form a precursor solution; exposing the precursor solution to an aqueous, basic solution to generate an aqueous phase and an organic phase, wherein the organic phase includes the first solvent; removing the aqueous phase; removing the first solvent from the organic phase to obtain a purified silane material; and diluting the purified silane material in a second solvent.

As mentioned, when the neat silane material includes the first silane monomer, and undesirably high levels of the second silane, the neat silane material may be diluted in a first solvent to form a precursor solution. Any aprotic solvent that solubilizes the silane and is immiscible with water may be used as the first solvent. An example of the first solvent is ethyl acetate.

The precursor solution is then exposed to the aqueous, basic solution to generate an aqueous phase and an organic phase (which includes the first silane monomer). An example of the aqueous, basic solution is a saturated sodium bicarbonate solution. The mixture may be stirred or otherwise mixed for a suitable time period to allow hydrolysis of the Si—Cl, and then may be allowed to settle for a sufficient time period to separate the aqueous and organic phases. In an example, vigorous mixing occurs for about 10 minutes. The hydrolyzable chloride group reacts with the base to form a water soluble salt, which is removed, e.g., by washing, from the organic phase. The organic phase includes the first silane monomer and the first solvent.

The aqueous phase may be removed from the organic phase. The aqueous phase and organic phase separate gravimetrically, as the heavier one settles to the bottom of the vessel. The heavier phase is drained from the bottom.

Additional water may be added to wash the organic phase. The entire process may be repeated multiple times (e.g., 2-4 times).

Prior to removing the first solvent from the organic phase, the organic phase may be dried, for example, using a desiccant, such as anhydrous magnesium sulfate. The organic phase may be dried for any suitable time period, e.g., from about 10 minutes to about 30 minutes. The desiccant may be filtered out before exposing the organic phase to further processing.

The first solvent may then be removed from the organic phase to obtain a purified silane material. Removal of the first solvent may involve the use of a rotary evaporator on the organic phase. In some examples, the purified silane material is a colorless liquid.

The purified silane material includes the first silane monomer and none of, or the desirably low level of, the second silane monomer. In this example, the purified silane material may be diluted in a second solvent to generate the formulation. The second solvent may be any aprotic solvent that i) solvates the neat silane material and ii) has a boiling point ranging from about 50° C. to about 250° C. Examples include those mentioned herein, such as THF, methyl THF, toluene, etc. The second solvent may be used in any suitable amount that results in the purified silane material being present in the formulation in an amount ranging from about 1 wt % to about 20 wt %. In other examples, the purified silane material may be present in the formulation in an amount ranging from about 5 wt % to about 15 wt %—e.g., from about 2 wt % to about 10 wt %.

Any example of the formulation may also include an inhibitor. One example inhibitor includes butylated hydroxytoluene (BHT), which may be used when THF is the solvent. Other inhibitors may be more suitable for other solvents. The amount of the inhibitor may range from about 100 ppm to about 500 ppm. In other examples, the amount of inhibitor may range from about 150 ppm to about 450 ppm—e.g., from about 125 ppm to about 475 ppm.

Any example of the formulation may be used to generate the anti-stick layer 16, and thus any examples of the imprinting apparatus 10, 10'. One example of the method for making the imprinting apparatus 10, 10' includes applying a formulation on a silicon master 12 including a plurality of features 14 positioned at an average pitch of less than about 425 nm, each of the plurality of features 14 having a largest opening dimension of about 300 nm, the formulation including a first silane monomer:

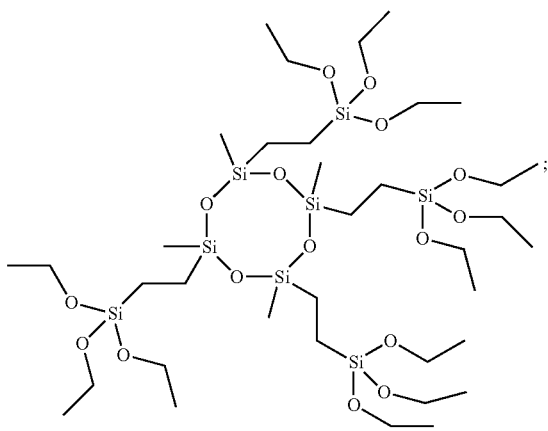 [SMILES: CCO[Si](CC[Si]1(C)O[Si](C)(CC[Si](OCC)(OCC)OCC)O[Si](C)(CC[Si](OCC)(OCC)OCC)O[Si](C)(CC[Si](OCC)(OCC)OCC)O1)(OCC)OCC]

and
less than 1.4 wt %, based on a total amount of silanes present in the formulation, of a second silane monomer including a hydrolyzable chloride group; and curing the applied formulation, thereby forming an anti-stick layer 16. This example method is shown in FIG. 3A through FIG. 3D.

Figure 3A:
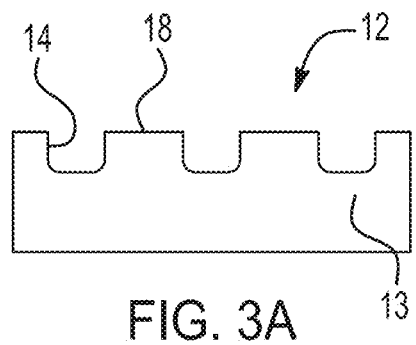
FIG. 3A through FIG. 3D depict an example of a method disclosed herein.

FIG. 3A depicts the silicon master 12, including the substrate 13 having the features 14 defined therein.

The formulation used in the method may be obtained (e.g., from a supplier, manufacturer, etc.) or prepared as described herein. As described herein, the formulation is solvent free or the formulation includes from about 1 wt % to about 20 wt % of the first silane monomer. When a solvent is included, the first silane monomer may present in an amount of 25 wt % or less (e.g., 24 wt %, 23 wt %, 22 wt %, 21 wt %, 20 wt %, or less). In other examples, the formulation includes from about 2.5 wt % to about 15 wt % of the first silane monomer, or from about 5 wt % to about 10 wt % of the first silane monomer. In any of the example formulations, the second silane monomer is present in an amount of about 2.0 wt % or less—e.g., about 1.5 wt %, about 1.4 wt %, about 1.2 wt %, or less, of the total amount of silanes present in the formulation. In some examples, the formulation includes from about 0.25 wt % to about 1 wt % of the second silane monomer.

Figure 3B:
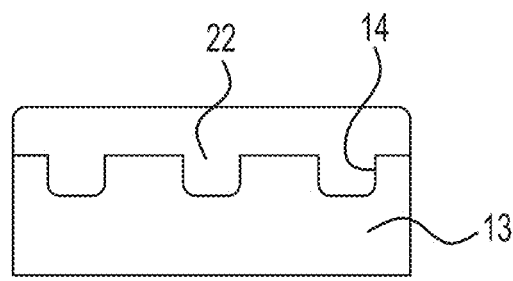

FIG. 3B depicts the formulation 22 applied on the silicon master 12. The formulation 22 may be applied on the silicon master 12 using any suitable deposition technique. In an example, applying the formulation involves spin coating. Spin coating may involve a slow phase in order to introduce a puddle of the formulation 22, which is allowed to incubate for a limited time period (e.g., up to 30 seconds. Water (e.g., from a cleaning step of the silicon master 12, from the air, etc.) may be introduced to the formulation during its application.

Curing the applied formulation involves one or more processes. In one example, curing involves an incubation process; a rinsing process after the incubation process; and a heating process after the rinsing process.

Figure 3C:
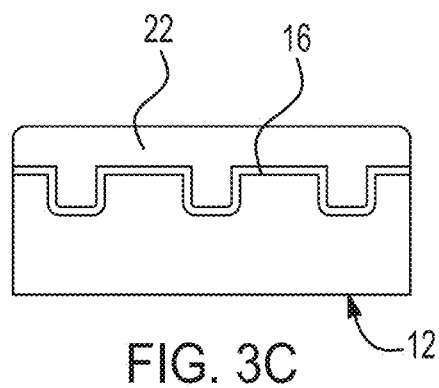

FIG. 3C illustrates the incubation process. Without being held to any theory, polymerization and crosslinking of the first silane monomer (and any dimers, trimers, and higher molecular weight species that may be present in the formulation) is initiated during the incubation process. As shown in FIG. 3C, the anti-stick layer 16 begins to form. One of the reactions that may take place involves the ethoxy R-groups of the first silane monomer, which can react with surface groups (e.g., silanols) of the silicon master 12 to attach the anti-stick layer 16 to the silicon master 12. Alternatively or additionally, silanols form on the monomers, and these silanols condense with silanols of the silicon master 12. Another of the reactions that may take place is the hydrolysis of the $CH_3CH_2O$—Si groups, which leads to condensation and polymerization of the silane into higher molecular weight species, such as dimers, trimers, higher molecular weight species and the highly crosslinked silane polymer network. Crosslinking may involve silanols on the monomer condensing with other monomer silanols or with ethoxy groups.

This heating process is performed at a suitable temperature and for a suitable time for polymerization and crosslinking of the first silane monomer to take place.

Figure 3D:
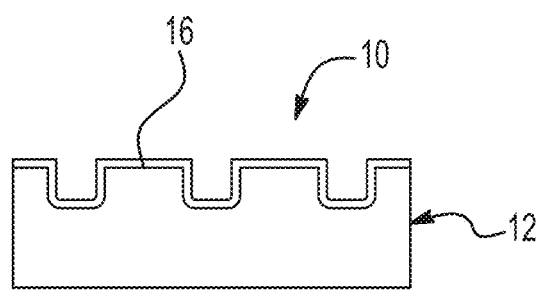

After the incubation step, rinsing may be performed. Rinsing may be performed with any solvent that solvates the monomers, dimers, trimers, and higher molecular weight species. As such, rising washes away any unreacted monomer(s), dimer(s), trimer(s) and/or higher molecular weight species, leaving the crosslinked silane polymer network, i.e., the anti-stick layer 16. The imprinting apparatus 10 after rinsing is shown in FIG. 3D.

The imprinting apparatus 10 (the silicon master 12 having the anti-stick layer 16 thereon) may then be expose to the second heating process. This heating process may be performed to dry the anti-stick layer 16, and thus remove any remaining water, solvent, etc. However, it is to be understood that crosslinking may be continued during this second heating process.

The first and second heating processes are independently performed at a temperature ranging from about 18° C. to about 260° C., for a time up to about 60 minutes. In an example, the first and second heating processes are independently performed at a temperature ranging from about 20° C. to about 250° C., for a time ranging from about 1 minute to about 30 minutes. In one example, the incubation process is accomplished at room temperature (e.g., about 20° C. to about 25° C.), for about 30 minutes. In another example, the incubation process is accomplished at a temperature ranging from about 100° C. to about 250° C., or from about 130° C. to about 250° C., for a time ranging from about 10 minutes to about 20 minutes. In still another example, the second heating process is accomplished at a temperature ranging from about 100° C. to about 250° C., or from about 110° C. to about 150° C., or from about 130° C. to about 250° C., for a time ranging from about 1 minute to about 5 minutes.

The kinetics of the formation of the higher molecular weight species from the first silane monomer may be relatively slow, such that rinsing and the subsequent heating (drying) processes remove unreacted monomers and loosely bound dimers, trimers, and/or higher molecular weight species before they can polymerize and crosslink. Therefore, membrane defects are not formed in the features 14 and/or over the feature openings 20 as droplets of the formulation 22 recede away from the features 14.

Method of Using the Imprinting Apparatus

The imprinting apparatus 10, 10' may be used to form a working stamp. An example of this method includes forming an imprinting apparatus 10, 10' by: depositing a formulation 22 on a silicon master 12 including a plurality of features 14 positioned at an average pitch ranging from about 340 nm to about 410 nm, each of the plurality of features having a largest opening dimension ranging from about 170 nm to about 290 nm, and the formulation 22 including a first silane monomer:

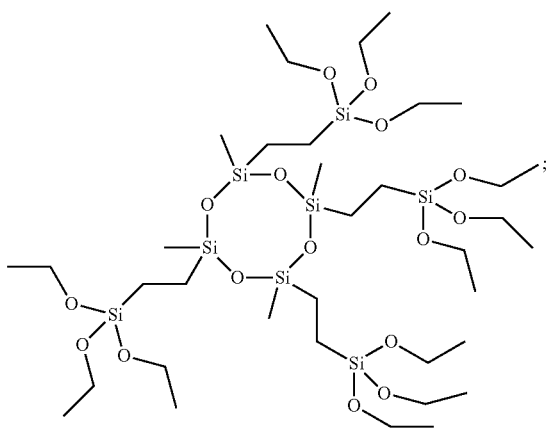 [SMILES: CCO[Si](CC[Si]1(C)O[Si](C)(CC[Si](OCC)(OCC)OCC)O[Si](C)(CC[Si](OCC)(OCC)OCC)O[Si](C)(CC[Si](OCC)(OCC)OCC)O1)(OCC)OCC]

and less than 1.4 wt %, based on a total amount of silanes present in the formulation, of a second silane monomer including a hydrolyzable chloride group; and curing the formulation 22, thereby forming an anti-stick layer 16 on the silicon master 12; depositing a silicon-based working stamp material on the anti-stick layer 16 of the imprinting apparatus 10, 10'; curing the silicon-based working stamp material to form a working stamp including a negative replica of the plurality of features 14; and releasing the working stamp from the imprinting apparatus 10, 10'. This example method is shown in FIG. 4A through FIG. 4D.

Figure 4A:
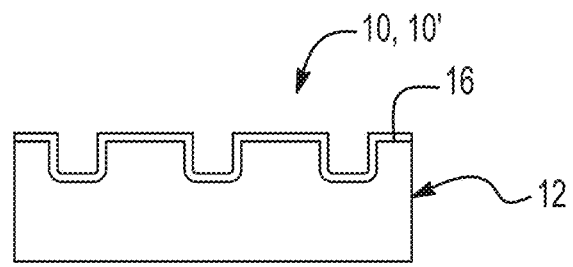
FIG. 4A through FIG. 4D depict another example of a method disclosed herein.

FIG. 4A depicts the imprinting apparatus 10, 10'. Any example of the imprinting apparatus 10, 10' may be used, and any method for making the imprinting apparatus 10, 10' may be used.

Figure 4B:
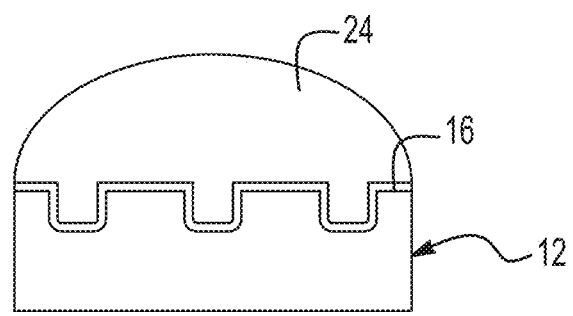

FIG. 4B depicts the application of the silicon-based working stamp (WS) material 24. By "silicon-based" material, it is meant that the material is composed of at least about 50 mol % of silicon containing molecules (repeating monomer units). In an example, the silicon-based WS material 24 is composed of about 100 mol % of silicon containing molecules (repeating monomer units). In a further example, the WS material 24 may be a "silicon-containing polymer" (i.e., a polymer having less than about 50 mol % of silicon containing molecules). In other examples, the WS material 24 comprises polymerized silicon acrylate or methacrylate monomers. In other examples, the WS material 24 also comprises at least one photoinitiator.

It is to be understood that any suitable deposition method may be used. Examples of suitable deposition techniques include spray coating, spin coating, dunk or dip coating, puddle dispensing, etc. In an example, the WS material 24 is spin coated onto the imprinting apparatus 10, 10'.

The method further includes curing the WS material 24, thereby forming a working stamp 28 including a negative replica of the plurality of features 14 (FIG. 4C), in contact (e.g., direct, physical contact) with the anti-stick layer 16 on the imprinting apparatus 10, 10'. In an example, the WS material 24 is cured via ultraviolet (UV) radiation. In another example, the WS material 24 is thermally cured. In some examples, the thermal curing may be performed at a temperature ranging from about 60° C. to about 300° C.

Figure 4C:
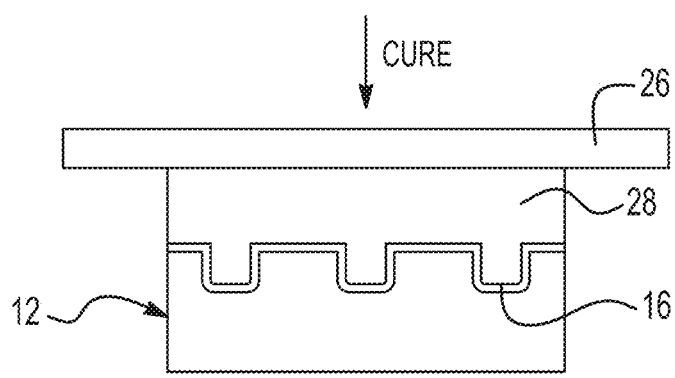

As shown in FIG. 4C, the method may further include attaching a backplane 26 to the working stamp 28. In an example, a polymer film including an adhesive material (not shown) may be applied (e.g., by roll coating) to the WS material 24 prior to curing, such that the adhesive contacts the WS material 24. Then when exposed to UV radiation, both the WS material 24 and the adhesive material will cure, thereby adhering the working stamp 28 to the backplane 26. It is to be understood that the backplane 26 may be formed from any suitable polymeric material. In an example, the backplane 26 is a polyethylene terephthalate (PET) film. Other examples of the backplane 26 include poly(vinyl chloride) (PVC) and propylene oxide (PO). In some aspects, the backplane material is flexible. It is to be further understood that the adhesive material may be any suitable UV curable material.

Figure 4D:
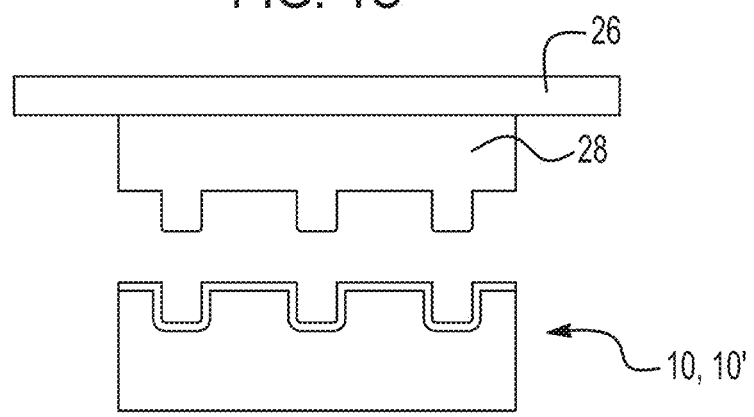

As shown in FIG. 4D, the method further includes releasing the working stamp 28 from the imprinting apparatus 10, 10'. In an example, the releasing is by unrolling/peeling the cured working stamp 28 from the imprinting apparatus 10, 10'. Other removal techniques may also be used.

The released working stamp 28 has more than 99.9% of the features 14 cleaning transferred (due to the lack of membrane defects in the imprinting apparatus 10, 10'), and is at least substantially free (i.e., free or substantially free) of the material of the anti-stick layer 16. Without being bound by any theory, it is believed that no transfer of the anti-stick layer 16 material should occur during the working stamp 28 fabrication process, as any excess of unreacted monomers, dimers, trimers, and/or higher molecular weight species should have been washed away before fabrication of the anti-stick layer 16. If any of the anti-stick layer 16 material does transfer, it is believed that it would be at the parts per million (ppm) level at most, and thus the working stamp 28 would be substantially free of the anti-stick layer 16 material.

To further illustrate the present disclosure, examples are given herein. It is to be understood that these examples are provided for illustrative purposes and are not to be construed as limiting the scope of the present disclosure.

NON-LIMITING WORKING EXAMPLES

Example 1

In order to examine the membrane defects, a formulation was prepared with a neat silane material that included both the first silane monomer (with Si—OCH$_2$CH$_3$ groups) and from about 5% to about 10% by weight of the second silane monomer (including at least one Si—Cl group). The formulation was prepared by diluting the neat silane material in anhydrous tetrahydrofuran (THF) to obtain a solution including about 10 wt % of the first silane monomer. An inhibitor, butylated hydroxytoluene (BHT), was added.

The formulation was spin coated on a silicon master with features defined therein. The features had diameters of about 220 nm and an average pitch of about 350 nm. Spin coating involved initially dispensing the formulation at a very low RPM, followed by about 30 seconds incubation, and then a faster spin to remove excess formulation.

The coated silicon master was exposed to heating at about 130° C. for about 10 minutes, then was rinsed with the solvent, and then was exposed to additional heating at about 130° C. for about 2 minutes.

Figure 5A:
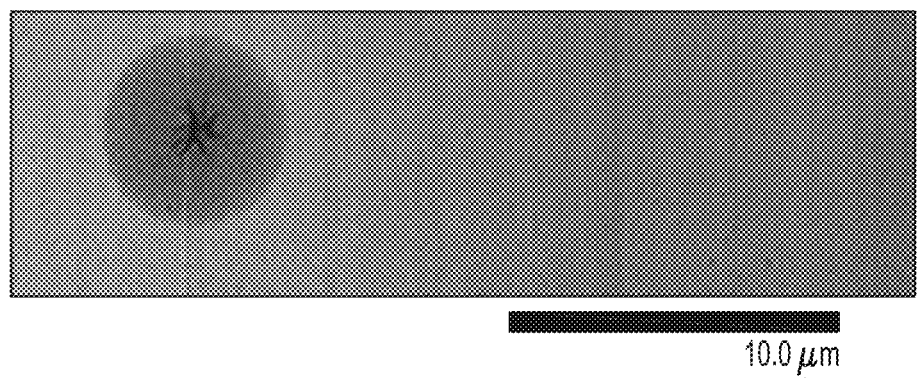
FIG. 5A is a black and white reproduction of an originally colored atomic force microscopy (AFM) image of a top view of an area with many features that are covered by a large membrane defect.
Figure 5B:
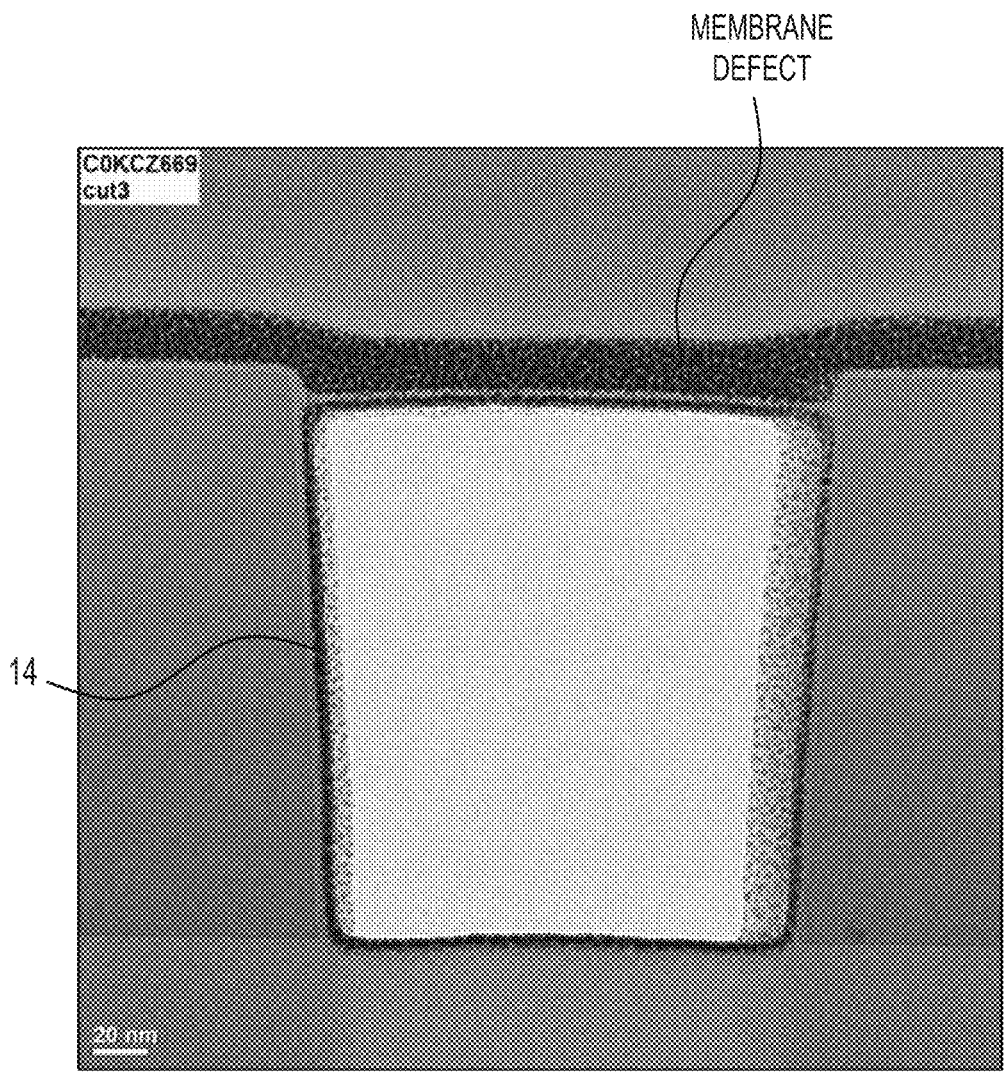
FIG. 5B is a transmission electron microscopy (TEM) image of a cross-sectional view of one of the features of FIG. 5A and a portion of the membrane defect at the feature's opening.

After processing, images were taken of a large area of the coated silicon master that included a plurality of the features. FIG. 5A depicts one membrane defect, which covered a plurality of the features. The darker portion in the center of the membrane defect indicated that more material was deposited at that portion. The cross-section of FIG. 5B depicts one of the features that was covered by the membrane defect. As shown, the built-up material, which is a portion of the membrane defect, was fully obstructing the feature. Based on these results, when the amount of the second silane monomer (and in particular, the chloride) in the neat material was 5% or greater, formation of the membrane defects was detected.

Example 2

Formulations with different amounts of the second silane monomer were prepared in order to examine the impact of the chloride content on the formation of the membrane defects.

Four different formulations were prepared. Two neat silane materials were used to prepare these formulations. A first neat silane material included the first silane monomer (with Si—OCH$_2$CH$_3$ groups) and about 0.14 wt % of the second silane monomer (including at least one Si—Cl group), providing a total of about 50 ppm of hydrolyzable chlorides. A second neat silane material included the first silane monomer (with Si—OCH$_2$CH$_3$ groups) and about 10 wt % of the second silane monomer (including at least one Si—Cl group), providing a total of about 4000 ppm of hydrolyzable chlorides. The first and second neat silane materials were combined to generate: neat material A including about 100 ppm of the hydrolyzable chlorides (about 0.28 wt % of the second silane monomer), neat material B including about 200 ppm of the hydrolyzable chlorides (about 0.56 wt % of the second silane monomer), neat material C including about 500 ppm of the hydrolyzable chlorides (about 1.4 wt % of the second silane monomer), and neat material D including about 1000 ppm of the hydrolyzable chlorides (about 2.8 wt % of the second silane monomer). Once the desirable percentage was obtained for each neat material, the respective neat material was diluted in anhydrous THF to formulate silane solutions (solution A made with neat material A, solution B made with neat material B, solution C made with neat material C, and solution D made with neat material D), each of which included about 10 wt % of the first silane monomer.

Solutions A-D were coated on respective silicon masters and cured using the process described in Example 1 to form respective imprinting devices A-D.

A respective working stamp was generated from each imprinting apparatus A-D, and the working stamps A-D were used to generate respective imprints A-D. When membrane defects are generated in the imprinting apparatus, the covered or filled features are not transferrable to the working stamp or to the final imprint. Any defects observed in the imprint (e.g., imprint defects) are indicative of membrane defects present in the imprinting apparatus.

Figure 6A:
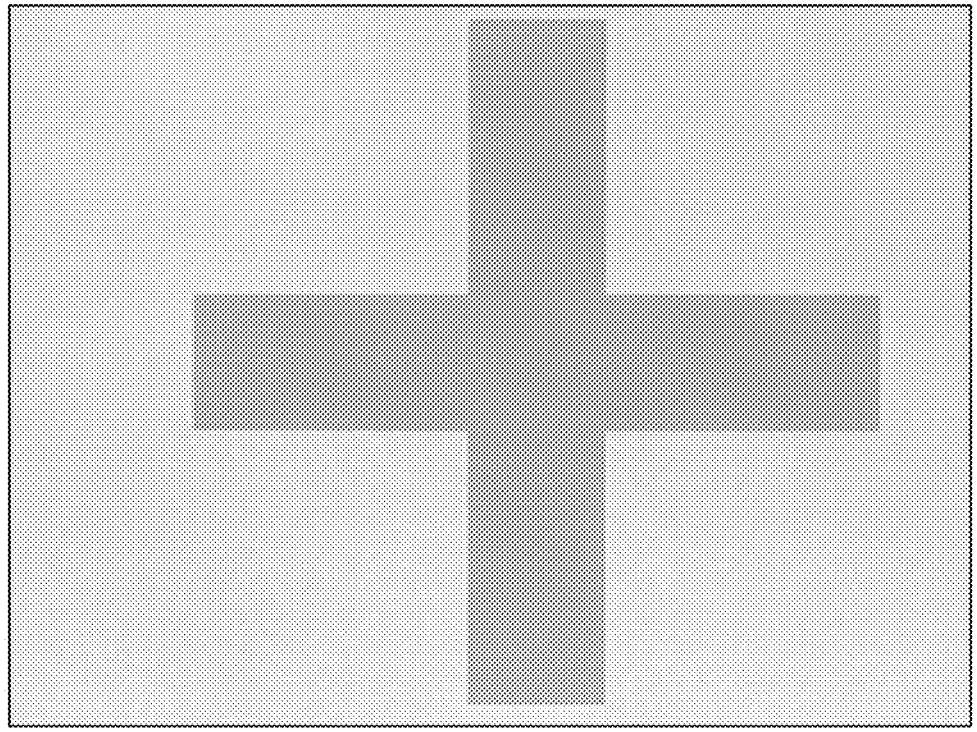
FIG. 6A through FIG. 6D are brightfield microscope images of imprints formed using respective working stamps created from imprinting apparatuses having anti-stick layers formed using formulations having different levels of hydrolyzable chlorides.
Figure 6B:
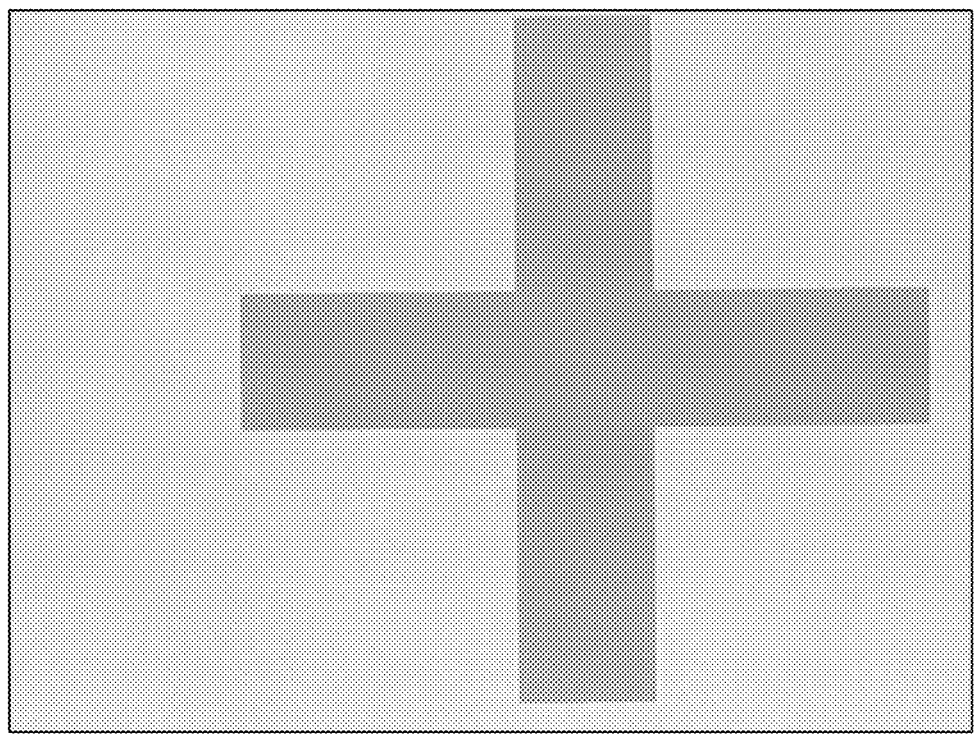
Figure 6C:
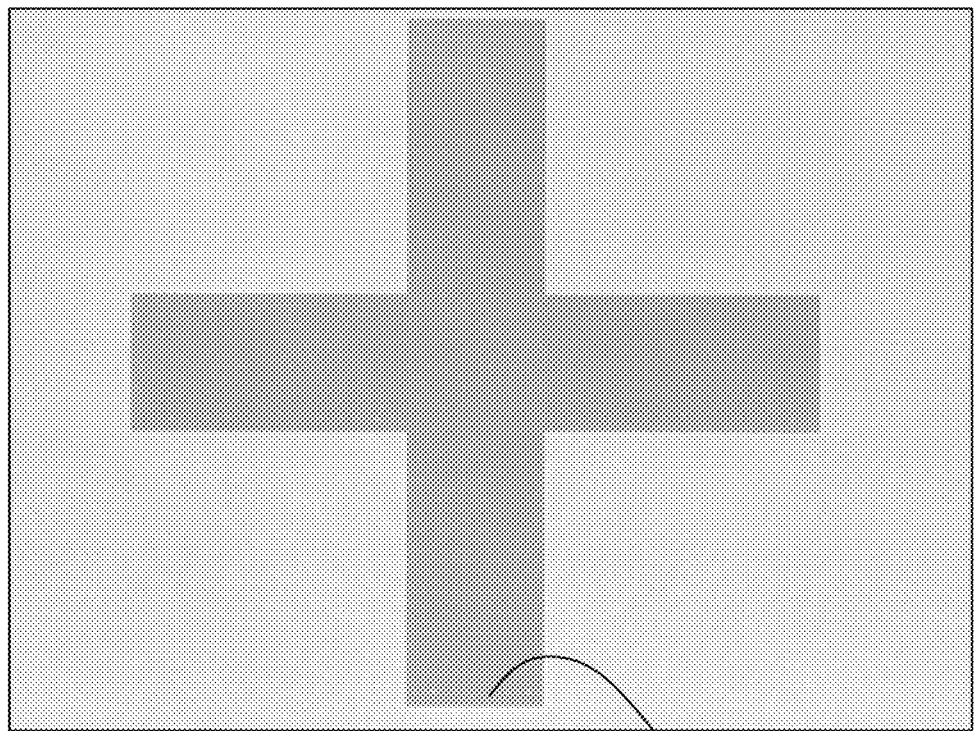
Figure 6D:
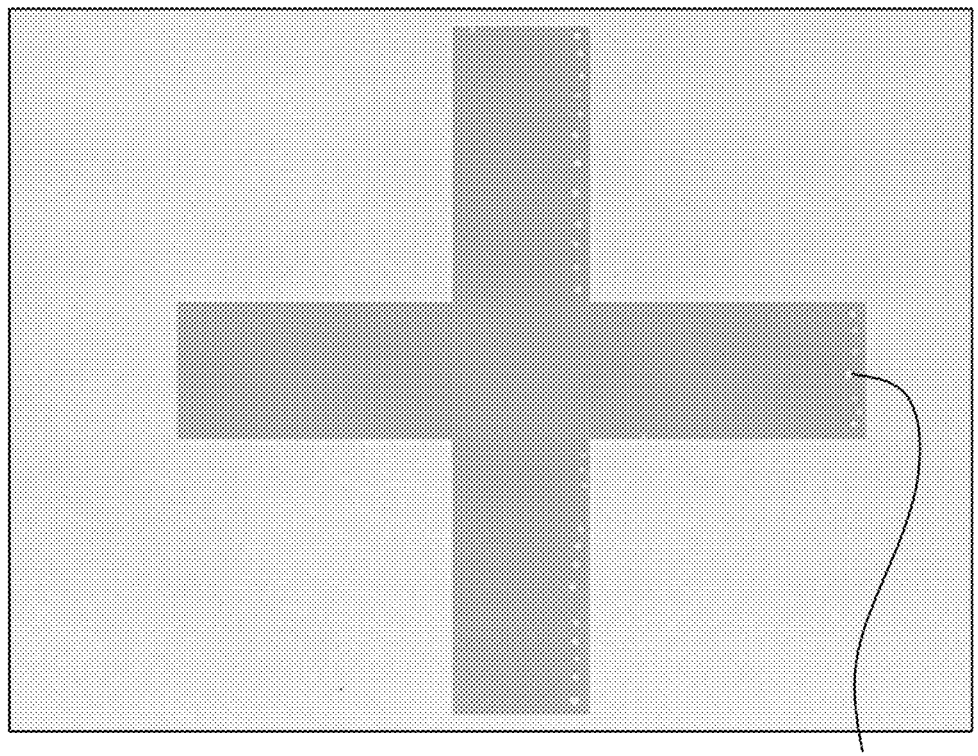

A Keyence confocal microscope was used to image the imprints A-D, and these images are shown in FIG. 6A (imprint A, formed using working stamp A generated from imprinting device A), FIG. 6B (imprint B, formed using working stamp B generated from imprinting device B), FIG. 6C (imprint C, formed using working stamp C generated from imprinting device C), and FIG. 6D (imprint D, formed using working stamp D generated from imprinting device D). As shown in FIGS. 6A and 6B, no imprint defects were observed in the imprints A and B, which were generated from the working stamps A and B, which were prepared, respectively, using imprinting devices A and B, whose anti-stick layers were prepared, respectively, with formulations having the 100 ppm and 200 ppm levels of the hydrolyzable chlorides. These images indicate that no membrane defects were present in the imprinting devices A and B. With imprint C (generated from the working stamp C, which was prepared using imprinting device C, whose anti-stick layer was prepared with solution C having 500 ppm hydrolyzable chlorides), a few imprint defects were observed, as shown in by the lighter dots in FIG. 6C. This image indicates that a few membrane defects were present in the imprinting device C. As depicted in FIG. 6D, several more imprint defects were observed with imprint D (generated from the working stamp D, which was prepared using imprinting device D, whose anti-stick layer was prepared with solution D having a level of hydrolyzable chlorides at 1000 ppm). This image indicates that several more membrane defects were present in the imprinting device D.

Figure 7:
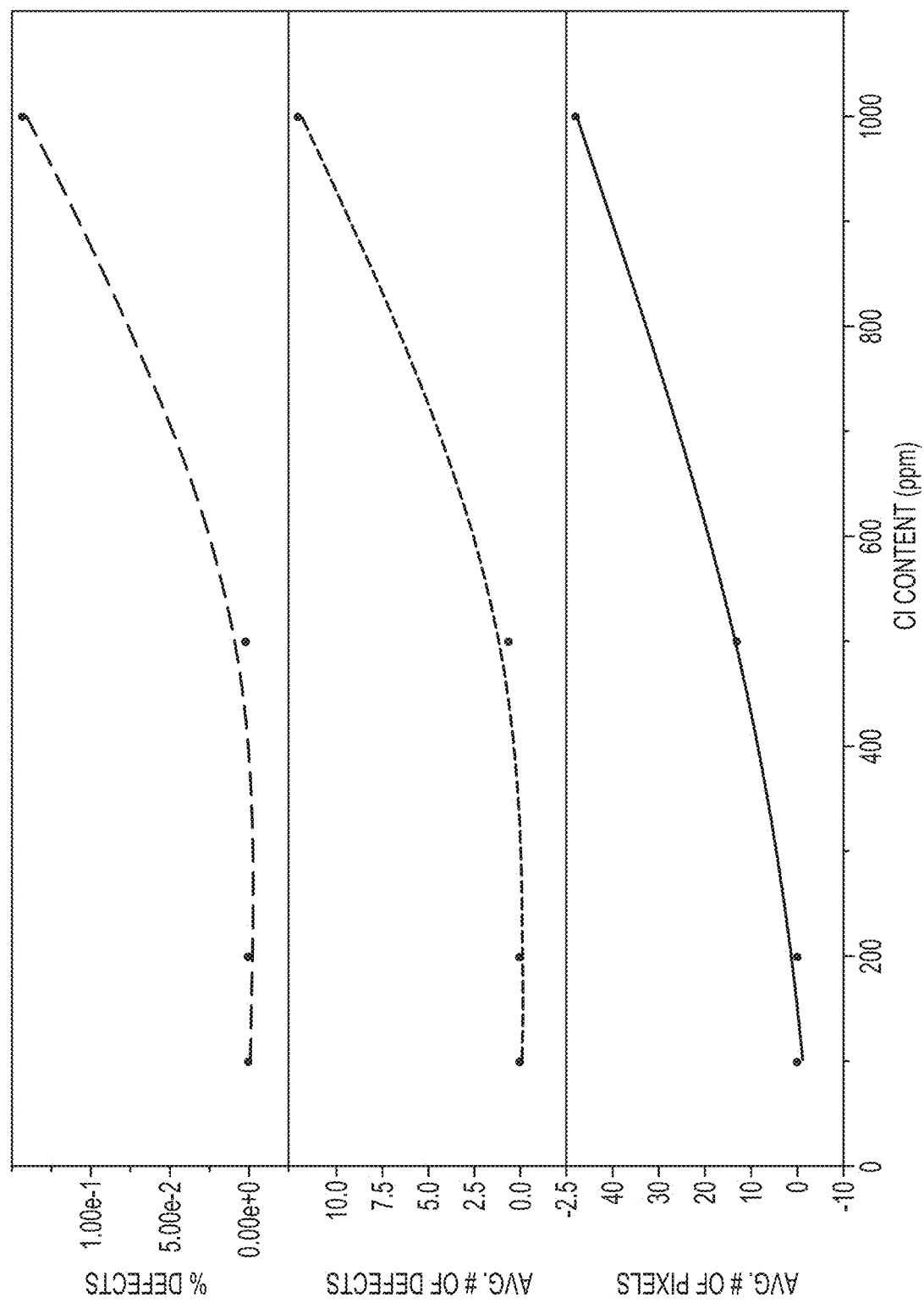
FIG. 7 includes three graphs, the top of which depicts the percentage of membrane defects in anti-stick layers versus the hydrolyzable chlorides in the formulation used to generate the anti-stick layers; the middle of which depicts the average number of membrane defects in anti-stick layers versus the hydrolyzable chlorides in the formulation used to generate the anti-stick layers; and the bottom of which depicts the average pixel size of membrane defects in anti-stick layers versus the hydrolyzable chlorides in the formulation used to generate the anti-stick layers.

Imprint defects were quantified via an image analysis script. The imprint defects correlate to membrane defects of the anti-stick layer of the imprinting devices formed with solutions A-D. The correlated results, which reflect membrane defects, are shown in FIG. 7. FIG. 7 depicts three sets of quantitative results.

The top graph of FIG. 7 depicts the percentage of membrane defects generated in the anti-stick layer versus the hydrolyzable chloride level (ppm) in the formulation used to generate anti-stick layer. The percentage is with respect to the total number of features in the imprinting apparatus. As shown, 0% of membrane defects were generated with the 100 ppm and 200 ppm formulations (solutions A and B, respectively), and while a slightly higher percentage was observed with the 500 ppm formulation (solution C), even this percentage was less than 0.05%. Over 0.1% of membrane defects were generated with the 1000 ppm formulation (solution D).

The middle graph of FIG. 7 depicts the average number of membrane defects generated in the anti-stick layer versus the hydrolyzable chloride level (ppm) in the formulation used to generate anti-stick layer. For each data point in the middle graph of FIG. 7, the average was taken for eight (8) cross shaped samples. As shown, the average number of membrane defects was zero (0) with the 100 ppm and 200 ppm formulations (solutions A and B, respectively) (solutions A and B, respectively). The average number of membrane defects with the 500 ppm formulation (solution C) was less than 1.5. In contrast, the average number of membrane defects was over 10 for the 1000 ppm formulation (solution D).

The bottom graph of FIG. 7 depicts the average pixels of the membrane defects generated in the anti-stick layer versus the hydrolyzable chloride level (ppm) in the formulation used to generate anti-stick layer. As no membrane defects were formed with the 100 ppm and 200 ppm formulations (solutions A and B, respectively), the average pixels were zero. The average pixels of the membrane defects generated with the 500 ppm formulation (solution C) were between 10 and 15. In contrast, the average pixels of the membrane defects generated with the 1000 ppm formulation (solution D) were over 40.

These results confirmed that the membrane defects formed more readily and were larger as the hydrolyzable chloride content in the formulation increased to 1000 ppm.

Example 3

In this example, two formulations were prepared. The formulations were prepared with a neat silane material that included both the first silane monomer (with Si—OCH$_2$CH$_3$ groups) and about 0.14 wt % of the second silane monomer (including at least one Si—Cl group). The formulations were prepared by diluting the neat silane material in anhydrous tetrahydrofuran (THF) to obtain a solution including about 10 wt % of the first silane monomer. An inhibitor, butylated hydroxytoluene (BHT), was added.

Figure 8A:
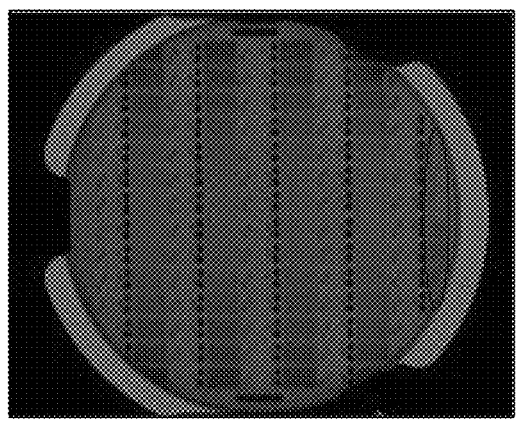
FIGS. 8A, 8B, and 8C are images of imprints formed using a working stamp created from an imprinting apparatus having an anti-stick layer generated with an unaged formulation.
Figure 8B:
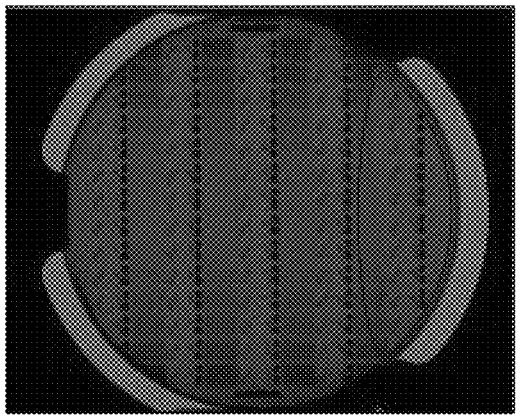
Figure 8C:
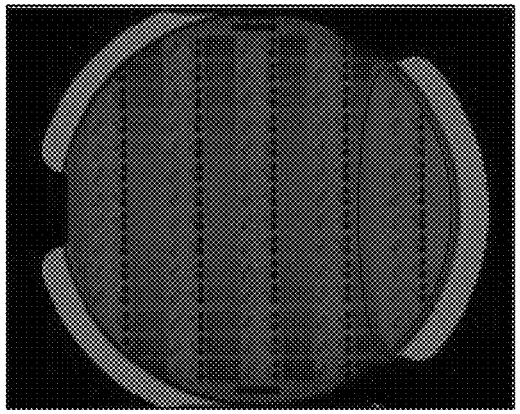

The first of the solutions was used to generate imprinting apparatus Y within 1 day of formulation generation, and thus was not aged. The unaged formulation was spin coated and cured as described in Example 1. A working stamp was generated from imprinting apparatus Y, and the working stamp was used to generate twenty-five imprints. Images of the 1$^{st}$, 10$^{th}$, and 25$^{th}$ imprints are shown in FIGS. 8A, 8B, and 8C, respectively. These images show a high level of detachment defects, or lost patterned area at the bottom of the wafer. Lost patterned areas are circled in each of the figures. These detachment defects are characteristic of poor coating of the formulation on the silicon master during generation of the imprinting apparatus.

Figure 9A:
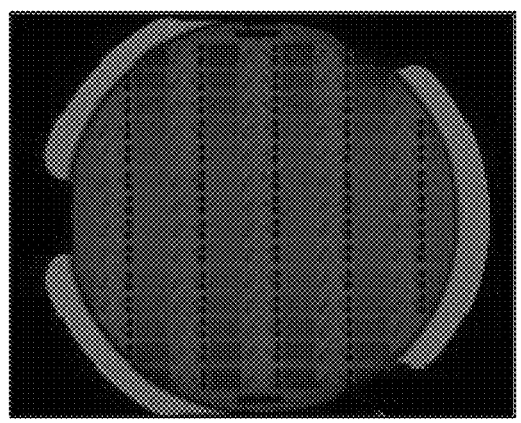
FIGS. 9A, 9B, and 9C are images of imprints formed using a working stamp created from an imprinting apparatus having an anti-stick layer generated with an aged formulation.
Figure 9B:
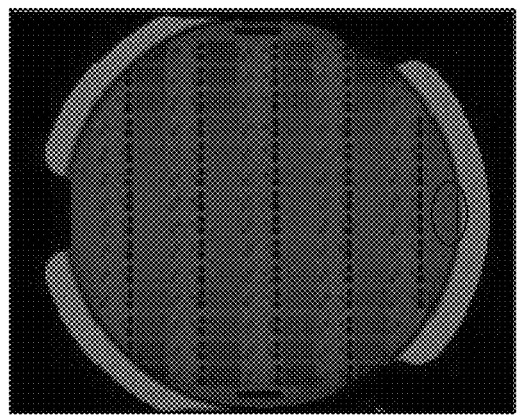
Figure 9C:
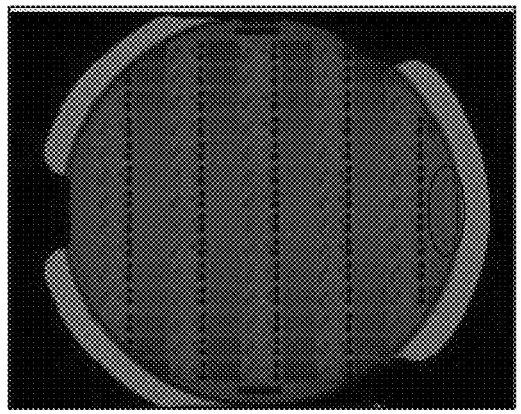

The second of the solutions was kept in room temperature storage for eight days, and then was used to generate imprinting apparatus Z. This formulation was also spin coated and cured as described in Example 1. Another working stamp was generated from imprinting apparatus Z, and the working stamp was used to generate twenty five imprints. Images of the 1$^{st}$, 10$^{th}$, and 25$^{th}$ imprints are shown in FIGS. 9A, 9B, and 9C, respectively. These images show a much lower level of detachment defects, or lost patterned area at the bottom of the wafer. These results indicate that, in this example, when the formulation was generated using a neat silane material with a desirable low level of hydrolyzable chlorides, aging the formulation helped improve the coatability of the formulation.

Example 4

In this example, a starting neat silane material was used that included both the first silane monomer (with Si—OCH$_2$CH$_3$ groups) and about 10 wt % of the second silane monomer (including at least one Si—Cl group), which provided about 4500 ppm of hydrolyzable chlorides. The neat silane material was diluted in ethyl acetate. An equal amount of a sodium bicarbonate solution was added and the combined solution was mixed for about 10 minutes. The water phase pH of about 9 was confirmed with pH paper. The aqueous phase was then removed. The remaining organic phase was dried with anhydrous magnesium sulfate for about 20 minutes. The anhydrous magnesium sulfate was filtered and any remaining ethyl acetate was removed by rotavaping. The result was a colorless liquid. This liquid was titrated to determine the percentage of the hydrolyzable chlorides that remained. The process was repeated until the level of hydrolyzable chloride was about 160 ppm. The solution was diluted in anhydrous THF to formulate a solution including about 10 wt % of the first silane monomer. The formulation was spin coated and cured as described in Example 1. No coating defects were observed.

ADDITIONAL NOTES

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range, as if such values or sub-ranges were explicitly recited. For example, a range of about 350 nm to about 400 nm, should be interpreted to include not only the explicitly recited limits of about 350 nm to about 400 nm, but also to include individual values, such as about 358 nm, about 375.5 nm, etc., and sub-ranges, such as from about 355 nm to about 395 nm, from about 350 nm to about 375 nm, etc. Furthermore, when "about" and/or "substantially" are/is utilized to describe a value, they are meant to encompass minor variations (up to +/−10%) from the stated value.

While several examples have been described in detail, it is to be understood that the disclosed examples may be modified. Therefore, the foregoing description is to be considered non-limiting.

What is claimed is:

1. A method, comprising:
applying a formulation on a surface of a silicon master including a plurality of features positioned at an average pitch of less than about 425 nm, each of the plurality of features having a largest opening dimension being less than about 300 nm, the formulation including:
a first silane monomer:

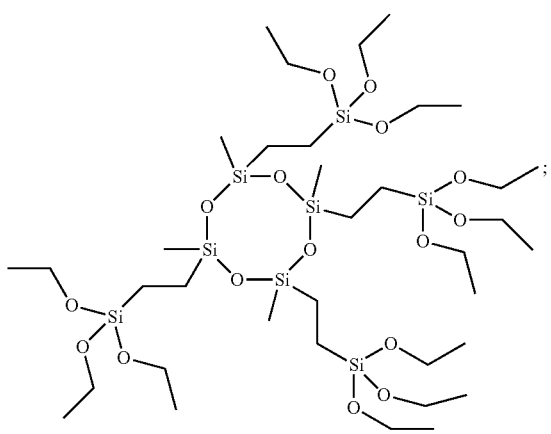 [SMILES: CCO[Si](CC[Si]1(C)O[Si](C)(CC[Si](OCC)(OCC)OCC)O[Si](C)(CC[Si](OCC)(OCC)OCC)O[Si](C)(CC[Si](OCC)(OCC)OCC)O1)(OCC)OCC]

and
a second silane monomer including a hydrolyzable chloride group, the second silane monomer being present in an amount ranging from 0.001 wt % to less than about 1.4 wt % based on a total weight of silanes present in the formulation; and curing the applied formulation, thereby forming an anti-stick layer.

2. The method as defined in claim 1, wherein the second silane monomer is:

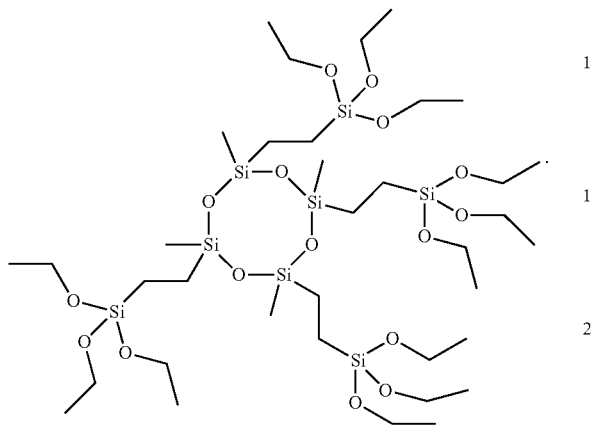

3. The method as defined in claim 1, wherein the formulation further includes:
i) a dimer including two bonded units of the first silane monomer;
ii) a trimer including three bonded units of the first silane monomer;
iii) a higher molecular species including more than three bonded units of the first silane monomer;
iv) the first silane monomer having at least one hydrolyzed ethoxy group;
or
v) any combination of i), ii), iii), and iv).

4. The method as defined in claim 1, wherein curing involves:
an incubation process;
a rinsing process after the incubation process; and
a heating process after the rinsing process.

5. The method as defined in claim 4, wherein the incubation process and the heating processes are independently performed at a temperature ranging from about 20° C. to about 250° C., for a time ranging from about 1 minute to about 30 minutes.

6. The method as defined in claim 1, further comprising generating the formulation by:
diluting a neat silane material including the first and second silane monomers in a first solvent to form a precursor solution;
exposing the precursor solution to an aqueous, basic solution to generate an aqueous phase and an organic phase, wherein the organic phase includes the first solvent;
removing the aqueous phase;
removing the first solvent from the organic phase to obtain a purified silane material; and
diluting the purified silane material in a second solvent.

7. The method as defined in claim 6, wherein the second solvent is an aprotic solvent that i) solvates the purified silane material and ii) has a boiling point ranging from about 50° C. to about 250° C.

8. The method as defined in claim 6, wherein the purified silane material is present in the formulation in an amount ranging from about 1 wt % to about 20 wt %.

9. The method as defined in claim 1, wherein applying the formulation involves spin coating.

10. The method as defined in claim 1, wherein one of:
the formulation is solvent free; or
the formulation includes from about 1 wt % to about 20 wt % of the first silane monomer.

11. The method as defined in claim 1, wherein the second silane monomer is present in an amount ranging from about 0.28 wt % to about 1.1 wt % based on the total weight of silanes present in the formulation.

12. A method, comprising:
forming an imprinting apparatus by:
depositing a formulation on a silicon master including a plurality of features positioned at an average pitch of less than about 425 nm, each of the plurality of features having a largest opening dimension of less than about 300 nm, and the formulation including:
a first silane monomer:

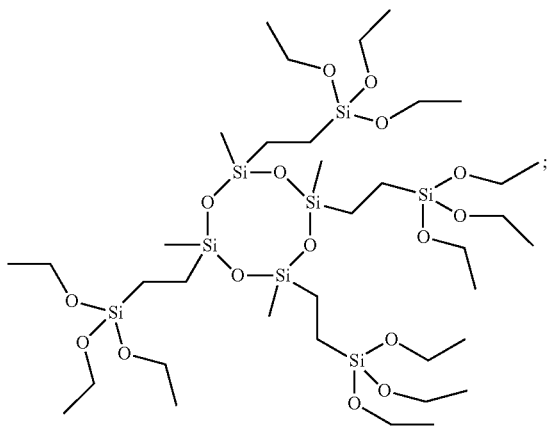 [SMILES: CCO[Si](CC[Si]1(C)O[Si](C)(CC[Si](OCC)(OCC)OCC)O[Si](C)(CC[Si](OCC)(OCC)OCC)O[Si](C)(CC[Si](OCC)(OCC)OCC)O1)(OCC)OCC]

and
a second silane monomer including a hydrolyzable chloride group, the second silane monomer being present in an amount ranging from about 0.001 wt % to less than about 1.4 wt % based on a total weight of silanes present in the formulation; and
curing the formulation, thereby forming an anti-stick layer on the silicon master;
depositing a silicon-based working stamp material on the anti-stick layer of the imprinting apparatus;
curing the silicon-based working stamp material to form a working stamp including a negative replica of the plurality of features; and
releasing the working stamp from the imprinting apparatus.

13. The method as defined in claim 12, wherein curing the formulation involves:
an incubation process;
a rinsing process after the incubation process; and
a heating process after the rinsing process.

14. The method as defined in claim 13, wherein the incubation and heating processes are independently performed at a temperature ranging from about 20° C. to about 250° C., for a time ranging from about 1 minute to about 30 minutes.

15. The method as defined in claim 12, wherein the silicon-based working stamp material includes a silicon acrylate monomer.

* * * * *